(12) United States Patent
Kamada et al.

(10) Patent No.: US 12,096,659 B2
(45) Date of Patent: Sep. 17, 2024

(54) DISPLAY DEVICE, DISPLAY MODULE, AND ELECTRONIC DEVICE

(71) Applicant: Semiconductor Energy Laboratory Co., Ltd., Atsugi (JP)

(72) Inventors: Taisuke Kamada, Niiza (JP); Ryo Hatsumi, Hadano (JP); Daisuke Kubota, Atsugi (JP); Daiki Nakamura, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 691 days.

(21) Appl. No.: 17/272,397

(22) PCT Filed: Aug. 30, 2019

(86) PCT No.: PCT/IB2019/057306
§ 371 (c)(1),
(2) Date: Mar. 1, 2021

(87) PCT Pub. No.: WO2020/053692
PCT Pub. Date: Mar. 19, 2020

(65) Prior Publication Data
US 2021/0327979 A1    Oct. 21, 2021

(30) Foreign Application Priority Data

Sep. 14, 2018  (JP) .................................. 2018-172247
Nov. 30, 2018  (JP) .................................. 2018-224324

(51) Int. Cl.
*H10K 59/122*  (2023.01)
*H05B 33/12*  (2006.01)
(Continued)

(52) U.S. Cl.
CPC ............ *H10K 59/122* (2023.02); *H05B 33/12* (2013.01); *H05B 33/22* (2013.01); *H10K 50/858* (2023.02);
(Continued)

(58) Field of Classification Search
CPC ...... H05B 33/12; H05B 33/22; H10K 50/125; H10K 50/858; H10K 50/865;
(Continued)

(56) References Cited

U.S. PATENT DOCUMENTS 8,835,911 B2    9/2014  Yamamoto et al.
9,088,006 B2    7/2015  Yamazaki et al.
(Continued)

FOREIGN PATENT DOCUMENTS

CN    001669296 A    9/2005
CN    101809746 A    8/2010
(Continued)

OTHER PUBLICATIONS

Taiwanese Office Action (Application No. 108131740) Dated Aug. 14, 2023.
(Continued)

*Primary Examiner* — Nicholas J Tobergte
*Assistant Examiner* — William Henry Anderson
(74) *Attorney, Agent, or Firm* — Eric J. Robinson; Robinson Intellectual Property Law Office, P.C.

(57) ABSTRACT

A display device having a photosensing function is provided. A highly convenient display device is provided. The display device includes a light-receiving element and a light-emitting element in a display portion. The light-receiving element includes a first pixel electrode, an active layer, and a common electrode. The light-emitting element includes a second pixel electrode, a light-emitting layer, and a common electrode. The active layer is positioned over the
(Continued)

first pixel electrode. The active layer contains a first organic compound. The light-emitting layer is positioned over the second pixel electrode. The light-emitting layer contains a second organic compound different from the first organic compound. The common electrode includes a portion overlapping with the first pixel electrode with the active layer provided therebetween, and a portion overlapping with the second pixel electrode with the light-emitting layer provided therebetween. The display device preferably further includes a common layer positioned over the first pixel electrode and the second pixel electrode. The common layer includes a portion overlapping with the active layer and a portion overlapping with the light-emitting layer.

15 Claims, 25 Drawing Sheets

(51) Int. Cl.
  H05B 33/22    (2006.01)
  H10K 50/858   (2023.01)
  H10K 50/86    (2023.01)
  H10K 59/00    (2023.01)
  H10K 59/35    (2023.01)
  H10K 50/125   (2023.01)
  H10K 102/00   (2023.01)
(52) U.S. Cl.
  CPC ......... H10K 50/865 (2023.02); H10K 59/00 (2023.02); H10K 59/353 (2023.02); H10K 50/125 (2023.02); H10K 59/35 (2023.02); H10K 2102/311 (2023.02)
(58) Field of Classification Search
  CPC .... H10K 59/122; H10K 59/126; H10K 59/35; H10K 59/353; G06F 3/0421; G06V 40/1318
  See application file for complete search history.

(56) References Cited

U.S. PATENT DOCUMENTS

| | | | |
|---|---|---|---|
| 9,155,498 B2 | 10/2015 | Akiyama | |
| 9,167,994 B2 | 10/2015 | Akiyama | |
| 9,627,648 B2 | 4/2017 | Yamazaki et al. | |
| 10,003,047 B2 | 6/2018 | Yamazaki et al. | |
| 10,431,164 B2 | 10/2019 | Okamoto | |
| 10,756,118 B2 | 8/2020 | Yamazaki et al. | |
| 11,233,100 B2 | 1/2022 | Feng et al. | |
| 11,456,320 B2 | 9/2022 | Yamazaki et al. | |
| 2004/0042707 A1 | 3/2004 | Imai et al. | |
| 2005/0253790 A1 | 11/2005 | Uchida | |
| 2008/0150848 A1* | 6/2008 | Chung .................... G06F 3/042 |
| | | | 345/82 |
| 2008/0252223 A1 | 10/2008 | Toyoda et al. | |
| 2009/0141004 A1 | 6/2009 | Yamazaki | |
| 2010/0033450 A1 | 2/2010 | Koyama et al. | |
| 2010/0085331 A1 | 4/2010 | Kurokawa et al. | |
| 2010/0117991 A1 | 5/2010 | Koyama et al. | |
| 2010/0156850 A1 | 6/2010 | Kurokawa | |
| 2010/0182282 A1 | 7/2010 | Kurokawa et al. | |
| 2010/0220041 A1 | 9/2010 | Smith | |
| 2010/0225615 A1 | 9/2010 | Kurokawa | |
| 2011/0001725 A1 | 1/2011 | Kurokawa | |
| 2011/0043464 A1* | 2/2011 | Lee ........................ G06F 3/0412 |
| | | | 345/173 |
| 2011/0043473 A1 | 2/2011 | Kozuma | |
| 2011/0062476 A1 | 3/2011 | Tobise | |
| 2011/0096009 A1 | 4/2011 | Kurokawa et al. | |
| 2011/0148835 A1 | 6/2011 | Yamazaki | |
| 2012/0085890 A1 | 4/2012 | Kurokawa | |
| 2012/0119073 A1 | 5/2012 | Kurokawa et al. | |
| 2013/0001610 A1 | 1/2013 | Iwakura et al. | |
| 2013/0075761 A1* | 3/2013 | Akiyama ................ H10K 65/00 |
| | | | 257/E31.095 |
| 2013/0299789 A1 | 11/2013 | Yamazaki et al. | |
| 2014/0085277 A1 | 3/2014 | Iwaki | |
| 2014/0340363 A1 | 11/2014 | Ikeda et al. | |
| 2014/0350366 A1 | 11/2014 | Akiyama | |
| 2015/0325812 A1 | 11/2015 | Yamazaki et al. | |
| 2015/0346897 A1 | 12/2015 | Irri et al. | |
| 2016/0093678 A1 | 3/2016 | Seo et al. | |
| 2016/0155782 A1 | 6/2016 | Sato | |
| 2016/0174847 A1 | 6/2016 | Tsuchiya | |
| 2017/0025444 A1 | 1/2017 | Hirakata | |
| 2017/0032728 A1 | 2/2017 | Shima et al. | |
| 2017/0098689 A1 | 4/2017 | Ikeda et al. | |
| 2017/0235381 A1 | 8/2017 | Katagiri | |
| 2017/0279081 A1 | 9/2017 | Yamazaki et al. | |
| 2017/0365224 A1 | 12/2017 | Okamoto | |
| 2017/0373036 A1 | 12/2017 | Yamazaki et al. | |
| 2018/0012943 A1 | 1/2018 | Ikeda et al. | |
| 2018/0151597 A1* | 5/2018 | Yamazaki ........... G06F 3/04166 |
| 2018/0247981 A1 | 8/2018 | Yamaoka et al. | |
| 2018/0294437 A1 | 10/2018 | Yamazaki et al. | |
| 2020/0357863 A1 | 11/2020 | Nakamura et al. | |
| 2021/0296409 A1* | 9/2021 | Yamazaki ............... H10K 30/20 |
| 2023/0014200 A1 | 1/2023 | Yamazaki et al. | |
| 2024/0045533 A1* | 2/2024 | Miyamoto ........... G09G 3/3225 |

FOREIGN PATENT DOCUMENTS

| | | | |
|---|---|---|---|
| CN | 102522422 A | 6/2012 | |
| CN | 102655224 A | 9/2012 | |
| CN | 103022072 A | 4/2013 | |
| CN | 104157665 A | 11/2014 | |
| CN | 104681593 A | 6/2015 | |
| CN | 105708413 A | 6/2016 | |
| CN | 107068716 A | 8/2017 | |
| CN | 108121123 A | 6/2018 | |
| DE | 112008002598 | 10/2010 | |
| EP | 3035244 A | 6/2016 | |
| GB | 2453172 | 4/2009 | |
| JP | 2003330383 A | * 11/2003 | |
| JP | 2004-045636 A | 2/2004 | |
| JP | 2008-262176 A | 10/2008 | |
| JP | 2008-281615 A | 11/2008 | |
| JP | 2010-541148 | 12/2010 | |
| JP | 2011-059621 A | 3/2011 | |
| JP | 2011-204384 A | 10/2011 | |
| JP | 2013-073965 A | 4/2013 | |
| JP | 2014-197522 A | 10/2014 | |
| JP | 2016-112279 A | 6/2016 | |
| JP | 2017-227896 A | 12/2017 | |
| JP | 2018-037356 A | 3/2018 | |
| KR | 2010-0087081 A | 8/2010 | |
| KR | 2013-0033278 A | 4/2013 | |
| TW | 200414095 | 8/2004 | |
| TW | 200921182 | 5/2009 | |
| TW | 201316495 | 4/2013 | |
| TW | 201320325 | 5/2013 | |
| TW | 201444321 | 11/2014 | |
| WO | WO-2004/008736 | 1/2004 | |
| WO | WO-2009/040429 | 4/2009 | |
| WO | WO-2011/118150 | 9/2011 | |

OTHER PUBLICATIONS

Chinese Office Action (Application No. 201980059134.1) Dated Oct. 15, 2023.
International Search Report (Application No. PCT/IB2019/057306) Dated Nov. 12, 2019.
Written Opinion (Application No. PCT/IB2019/057306) Dated Nov. 12, 2019.
Akkerman.H et al., "Printed Organic Photodetector Arrays and their use in Palmprint Scanners", SID Digest '18 : SID International Symposium Digest of Technical Papers, May 22, 2018, vol. 49, No. 1, pp. 494-497.

(56) References Cited

OTHER PUBLICATIONS

Search Report (GB 0719020.0 Filed Sep. 28, 2007) Dated Feb. 26, 2008 (1 page).

* cited by examiner

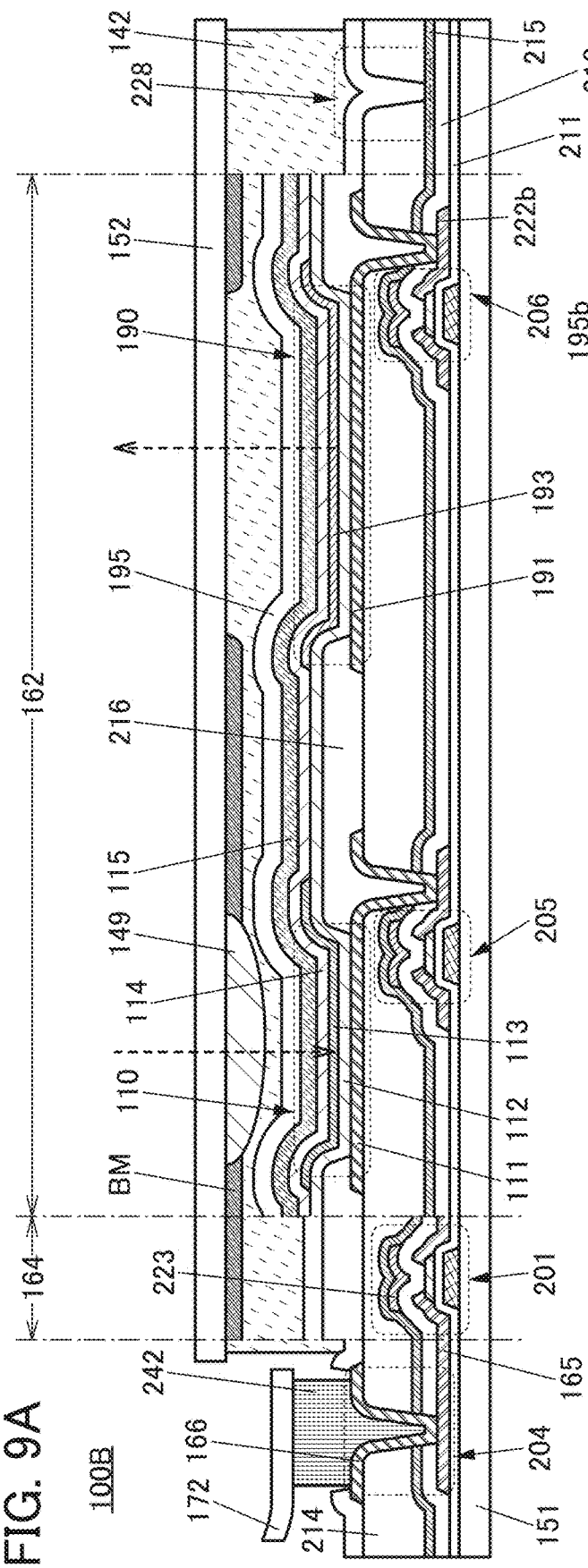

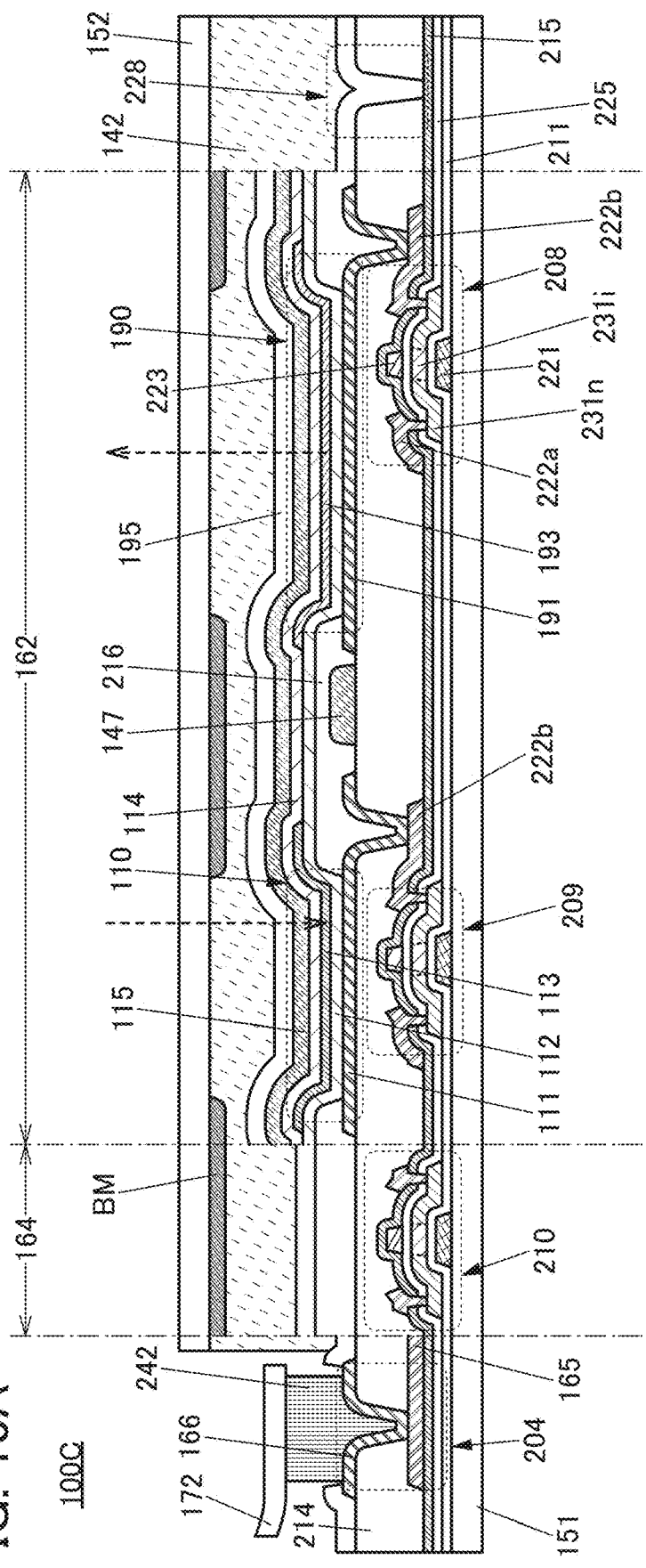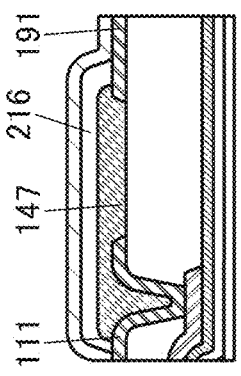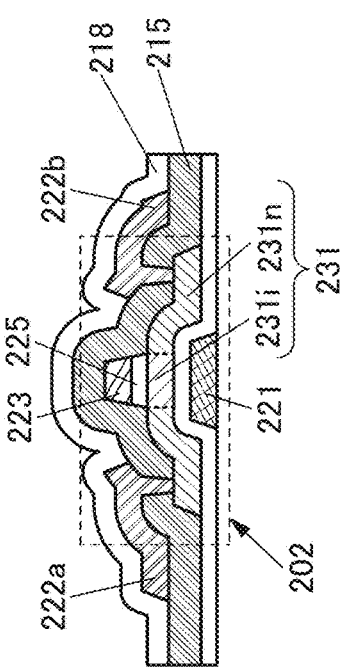
FIG. 10A
FIG. 10C
FIG. 10B

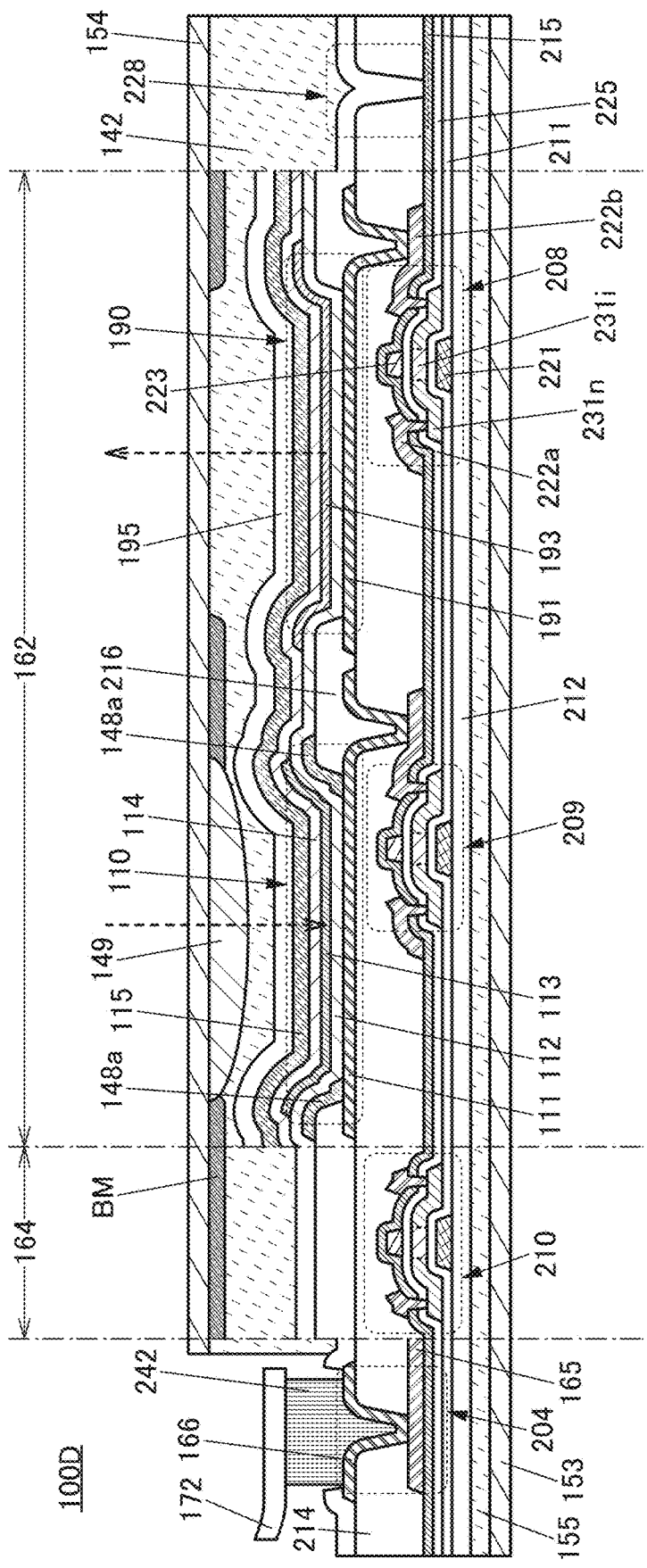

FIG. 21

| OPD | OLED Red | OLED Green | OLED Blue |
|---|---|---|---|
| 115 | | | |
| 114b | | | |
| 114a | | | |
| 113 | 193R | 193G | 193B |
| 186 | 196R | 196G | 196B |
| 112 | | | |
| 111 | 191 | 191 | 191 |
| 43 | 44 | 44 | 44 |
| 151 | | | |

10mm

DISPLAY DEVICE, DISPLAY MODULE, AND ELECTRONIC DEVICE

TECHNICAL FIELD

One embodiment of the present invention relates to a display device, a display module, and an electronic device. One embodiment of the present invention relates to a display device including a light-receiving element and a light-emitting element.

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device (e.g., a touch sensor), an input/output device (e.g., a touch panel), a driving method thereof, or a manufacturing method thereof.

BACKGROUND ART

In recent years, application of display devices to a variety of uses has been expected. Examples of uses for a large display device include a television device for home use (also referred to as a TV or a television receiver), digital signage, and a PID (Public Information Display). In addition, a smartphone and a tablet terminal including a touch panel are being developed as portable information terminals.

Light-emitting devices including light-emitting elements have been developed, for example, as display devices. Light-emitting elements (also referred to as EL elements) utilizing an electroluminescence (hereinafter referred to as EL) phenomenon have features such as ease of reduction in thickness and weight, high-speed response to an input signal, and driving with a direct-current low voltage source, and have been used in display devices. For example, Patent Document 1 discloses a flexible light-emitting device including an organic EL element.

REFERENCE

Patent Document

[Patent Document 1] Japanese Published Patent Application No. 2014-197522

SUMMARY OF THE INVENTION

Problems to be Solved by the Invention

An object of one embodiment of the present invention is to provide a display device having a photosensing function. An object of one embodiment of the present invention is to provide a highly convenient display device. An object of one embodiment of the present invention is to provide a multifunctional display device. An object of one embodiment of the present invention is to provide a novel display device.

Note that the description of these objects does not preclude the existence of other objects. One embodiment of the present invention does not need to achieve all the objects. Other objects can be derived from the descriptions of the specification, the drawings, and the claims.

Means for Solving the Problems

One embodiment of the present invention is a display device including a light-receiving element and a first light-emitting element in a display portion. The light-receiving element includes a first pixel electrode, an active layer, and a common electrode. The first light-emitting element includes a second pixel electrode, a light-emitting layer, and the common electrode. The active layer is positioned over the first pixel electrode. The active layer contains a first organic compound. The light-emitting layer is positioned over the second pixel electrode. The light-emitting layer contains a second organic compound different from the first organic compound. The common electrode includes a portion overlapping with the first pixel electrode with the active layer provided therebetween, and a portion overlapping with the second pixel electrode with the light-emitting layer provided therebetween.

One embodiment of the present invention is a display device including a light-receiving element and a first light-emitting element in a display portion. The light-receiving element includes a first pixel electrode, a common layer, an active layer, and a common electrode. The first light-emitting element includes a second pixel electrode, the common layer, a light-emitting layer, and the common electrode. The active layer is positioned over the first pixel electrode. The active layer contains a first organic compound. The light-emitting layer is positioned over the second pixel electrode. The light-emitting layer contains a second organic compound different from the first organic compound. The common layer is positioned over the first pixel electrode and the second pixel electrode. The common layer includes a portion overlapping with the active layer and a portion overlapping with the light-emitting layer. The common electrode includes a portion overlapping with the first pixel electrode with the common layer and the active layer provided therebetween, and a portion overlapping with the second pixel electrode with the common layer and the light-emitting layer provided therebetween.

One embodiment of the present invention is a display device including a light-receiving element, a first light-emitting element, and a second light-emitting element in a display portion. The light-receiving element includes a first pixel electrode, a common layer, an active layer, and a common electrode. The first light-emitting element includes a second pixel electrode, the common layer, a first light-emitting layer, and the common electrode. The second light-emitting element includes a third pixel electrode, the common layer, a second light-emitting layer, and the common electrode. The active layer is positioned over the first pixel electrode. The active layer contains a first organic compound. The first light-emitting layer is positioned over the second pixel electrode. The first light-emitting layer contains a second organic compound different from the first organic compound. The second light-emitting layer is positioned over the third pixel electrode. The second light-emitting layer contains a third organic compound different from the first organic compound and the second organic compound. The common layer is positioned over the first pixel electrode, the second pixel electrode, and the third pixel electrode. The common layer includes a portion overlapping with the active layer, a portion overlapping with the first light-emitting layer, and a portion overlapping with the second light-emitting layer. The common electrode includes a portion overlapping with the first pixel electrode with the common layer and the active layer provided therebetween, a portion overlapping with the second pixel electrode with the common layer and the first light-emitting layer provided therebetween, and a portion overlapping with the third pixel electrode with the common layer and the second light-emitting layer provided therebetween.

It is preferable that the display portion further include a lens. The lens preferably includes a portion overlapping with the light-receiving element. Light passing through the lens enters the light-receiving element.

It is preferable that the display portion further include a bank. The bank preferably covers an end portion of the first pixel electrode and an end portion of the second pixel electrode. The bank preferably has a function of electrically isolating the first pixel electrode and the second pixel electrode. The bank preferably has a function of absorbing at least part of light emitted by the first light-emitting element.

It is preferable that the display portion further include a colored layer. The colored layer preferably includes a portion in contact with a top surface of the first pixel electrode and a portion in contact with a side surface of the bank.

Alternatively, it is preferable that the display portion further include an insulating layer and a colored layer.

Each of the colored layer, the first pixel electrode, and the second pixel electrode preferably includes a portion in contact with a top surface of the insulating layer. In this case, the bank preferably covers a top surface and a side surface of the colored layer.

Alternatively, each of the bank, the first pixel electrode, and the second pixel electrode preferably includes a portion in contact with a top surface of the insulating layer. In this case, the bank preferably has an opening reaching the insulating layer, and the colored layer preferably includes a portion in contact with the insulating layer through the opening and a portion in contact with a top surface of the bank.

The colored layer preferably includes a color filter or a black matrix.

It is preferable that the display portion further include a light-blocking layer. An end portion of the light-blocking layer preferably overlaps with an end portion of the lens. The light-blocking layer preferably overlaps with the bank.

The display portion preferably has flexibility.

One embodiment of the present invention is a module including the display device having any of the above structures. Examples of the module includes a module provided with a connector such as a flexible printed circuit (hereinafter referred to FPC) or a TCP (Tape Carrier Package), or a module on which an integrated circuit (IC) is implemented by a COG (Chip On Glass) method, a COF (Chip On Film) method, or the like.

One embodiment of the present invention is an electronic device including the above module and at least one of an antenna, a battery, a housing, a camera, a speaker, a microphone, and an operation button.

Effect of the Invention

According to one embodiment of the present invention, a display device having a photosensing function can be provided. According to one embodiment of the present invention, a highly convenient display device can be provided. According to one embodiment of the present invention, a multifunction display device can be provided. According to one embodiment of the present invention, a novel display device can be provided.

Note that the description of the effects does not preclude the existence of other effects. One embodiment of the present invention does not need to have all the effects. Other effects can be derived from the descriptions of the specification, the drawings, and the claims.

BRIEF DESCRIPTION OF THE DRAWINGS

FIG. 9A and FIG. 9B are cross-sectional views illustrating an example of a display device.

FIG. 10A, FIG. 10B, and FIG. 10C are cross-sectional views illustrating an example of a display device.

FIG. 11 is a cross-sectional view illustrating an example of a display device.

FIG. 21 is a diagram illustrating a device structure forming a pixel in a display device in Example 3.

MODE FOR CARRYING OUT THE INVENTION

Figure 1A:
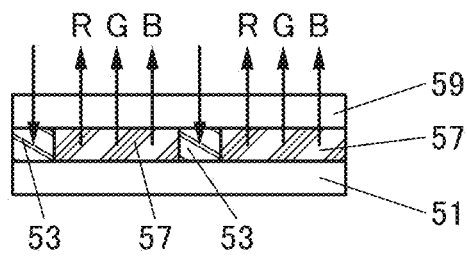
FIG. 1A, FIG. 1B, FIG. 1C, and FIG. 1D are each a cross-sectional view illustrating an example of a display device.

Embodiments are described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the description in the following embodiments.

Note that in structures of the present invention described below, the same portions or portions having similar functions are denoted by the same reference numerals in different drawings, and a description thereof is not repeated. Furthermore, the same hatch pattern is used for the portions having similar functions, and the portions are not especially denoted by reference numerals in some cases.

In addition, the position, size, range, or the like of each structure illustrated in drawings does not represent the actual position, size, range, or the like in some cases for easy understanding. Therefore, the disclosed invention is not necessarily limited to the position, size, range, or the like disclosed in the drawings.

Note that the term "film" and the term "layer" can be interchanged with each other depending on the case or circumstances. For example, the term "conductive layer" can be changed into the term "conductive film". As another example, the term "insulating film" can be changed into the term "insulating layer".

Embodiment 1

In this embodiment, a display device of one embodiment of the present invention will be described with reference to FIG. 1 to FIG. 11.

In a display device of this embodiment, a display portion includes light-receiving elements and light-emitting elements. Specifically, the light-emitting elements are arranged in a matrix in the display portion, and an image can be displayed in the display portion. Moreover, the light-receiving elements are arranged in a matrix in the display portion, and the display portion also has a function of a light-receiving portion. The light-receiving portion can be used as an image sensor or a touch sensor. That is, by sensing light with the light-receiving portion, an image can be captured and the approach or contact of an object (e.g., a finger or a stylus) can be detected.

When the object reflects light emitted by the light-emitting element included in the display portion, the light-receiving element can sense the reflected light; thus, the display device of this embodiment enables capturing an image and detection of touch (including near touch) even in a dark place.

The display device of this embodiment has a function of displaying an image with use of the light-emitting element. That is, the light-emitting element functions as a display element.

As the light-emitting element, an EL element such as an OLED (Organic Light Emitting Diode) or a QLED (Quantum-dot Light Emitting Diode) is preferably used. As a light-emitting substance contained in the EL element, a substance emitting fluorescence (a fluorescent material), a substance emitting phosphorescence (a phosphorescent material), an inorganic compound (such as a quantum dot material), a substance exhibiting thermally activated delayed fluorescence (a thermally activated delayed fluorescent (TADF) material), or the like can be given. Alternatively, an LED such as a micro-LED (Light Emitting Diode) can be used as the light-emitting element.

The display device of this embodiment has a function of sensing light with use of the light-receiving element.

When the light-receiving element is used as an image sensor, the display device of this embodiment can capture an image using the light-receiving element.

For example, data on a fingerprint, a palm print, an iris, or the like can be acquired with the image sensor. That is, a biological authentication sensor can be incorporated into the display device of this embodiment. When the display device incorporates a biological authentication sensor, the number of components of an electronic device can be reduced as compared to the case where a biological authentication sensor is provided separately from the display device; thus, the size and weight of the electronic device can be reduced.

In addition, data on facial expression, eye movement, change of the pupil diameter, or the like of a user can be acquired with the image sensor. By analysis of the data, data on the user's physical and mental state can be acquired. Changing the output contents of one or both of display and sound on the basis of the data allows the user to safely use a device for VR (virtual reality), AR (augmented reality), or MR (mixed reality), for example.

When the light-receiving element is used as a touch sensor, the display device of this embodiment can detect the approach or contact of an object with use of the light-receiving element.

As the light-receiving element, a PN photodiode or a PIN photodiode can be used, for example. The light-receiving element functions as a photoelectric conversion element that senses light incident on the light-receiving element and generates charge. The amount of generated electric charge depends on the amount of incident light.

It is particularly preferable to use an organic photodiode including a layer containing an organic compound as the light-receiving element. An organic photodiode, which is easily made thin, lightweight, and large in area and has a high degree of freedom for shape and design, can be used in a variety of display devices.

In one embodiment of the present invention, an organic EL element is used as the light-emitting element, and an organic photodiode is used as the light-receiving element. The structure of the organic photodiode can have many layers shared with the organic EL elements. Accordingly, the light-receiving element can be incorporated in the display device without a significant increase in the number of manufacturing steps. For example, an active layer of a light-receiving element and a light-emitting layer of a light-emitting element are separately formed, and the other layers can be shared by the light-emitting element and the light-receiving element. Note that a layer shared by the light-receiving element and the light-emitting element may have functions different in the light-receiving element and the light-emitting element. In this specification, the name of a component is based on its function in the light-emitting element. For example, a hole-injection layer functions as a hole-injection layer in the light-emitting element and functions as a hole-transport layer in the light-receiving element. Similarly, an electron-injection layer functions as an electron-injection layer in the light-emitting element and functions as an electron-transport layer in the light-receiving element.

FIG. 1A to FIG. 1D are cross-sectional views of display devices of one embodiment of the present invention.

A display device 50A illustrated in FIG. 1A includes a layer 53 including a light-receiving element and a layer 57 including a light-emitting element between a substrate 51 and a substrate 59.

Figure 1B:
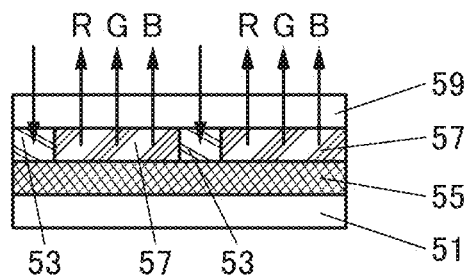

A display device 50B illustrated in FIG. 1B includes the layer 53 including a light-receiving element, a layer 55 including transistors, and the layer 57 including a light-emitting element between the substrate 51 and the substrate 59.

In the display device 50A and the display device 50B, red (R) light, green (G) light, and blue (B) light are emitted from the layer 57 including a light-emitting element.

Each of the display devices of one embodiment of the present invention includes a plurality of pixels arranged in a matrix. One pixel includes at least one subpixel. One subpixel includes one light-emitting element. For example, the pixel can include three subpixels (e.g., three colors of R, G, and B or three colors of yellow (Y), cyan (C), and magenta (M)) or four subpixels (e.g., four colors of R, G, B, and white (W) or four colors of R, G, B, and Y). The pixel further includes a light-receiving element. The light-receiving element may be provided in all of the pixels or in some of the pixels. In addition, one pixel may include a plurality of light-receiving elements.

The layer 55 including transistors preferably includes a first transistor and a second transistor. The first transistor is electrically connected to the light-receiving element. The first transistor is electrically connected to the light-emitting element.

Figure 1C:
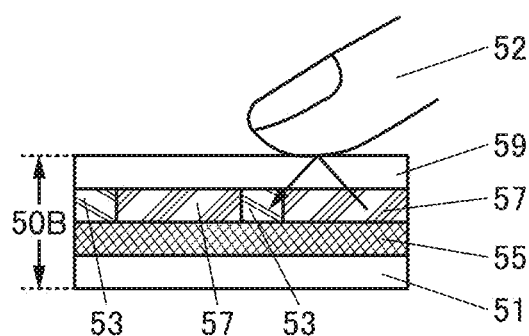

The display device of one embodiment of the present invention may have a function of detecting an object such as a finger that is touching the display unit. For example, after light emitted from the light-emitting element in the layer 57 including a light-emitting element is reflected by a finger 52 that touches the display device 50B as illustrated in FIG. 1C, the light-receiving element in the layer 53 including a light-receiving element senses the reflected light. Thus, the touch of the finger 52 on the display device 50B can be detected.

Figure 1D:
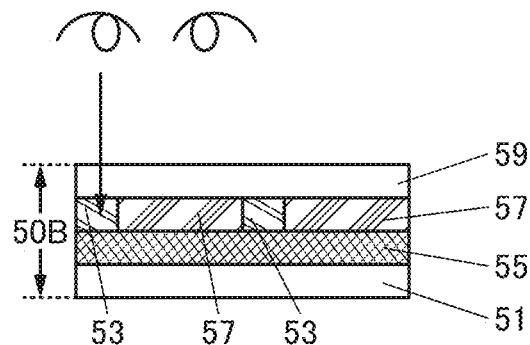

The display device of one embodiment of the present invention may have a function of detecting an object that is close to (but is not touching) the display device 50B as illustrated in FIG. 1D or capturing an image of such an object.

FIG. 1E to FIG. 1H illustrate examples of pixels.

Figure 1E:
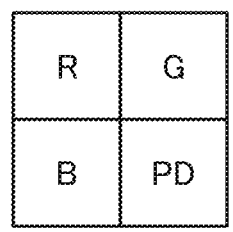
FIG. 1E, FIG. 1F, FIG. 1G, and FIG. 1H are each a top view illustrating an example of a pixel.
Figure 1F:
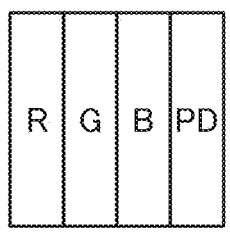

The pixel illustrated in each of FIG. 1E and FIG. 1F includes three subpixels (three light-emitting elements) of R, G, and B and a light-receiving element PD. FIG. 1E illustrates an example in which the three subpixels and the light-receiving element PD are arranged in a 2×2 matrix. FIG. 1F illustrates an example in which the three subpixels and the light-receiving element PD are arranged horizontally in one line.

Figure 1G:
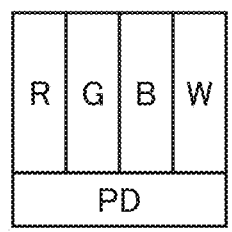

The pixel illustrated in FIG. 1G includes four subpixels (four light-emitting elements) of R, G, B, and W and the light-receiving element PD.

Figure 1H:
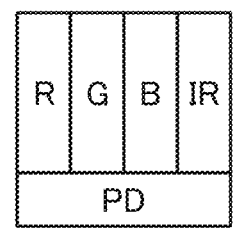

The pixel illustrated in FIG. 1H includes three subpixels of R, G, and B, a light-emitting element IR that emits infrared light, and the light-receiving element PD. Here, the light-receiving element PD preferably has a function of sensing infrared light. The light-emitting element PD may have a function of sensing both visible light and infrared light. The wavelength of light sensed by the light-receiving element PD can be determined depending on the application of the sensor.

A detailed structure of the display device of one embodiment of the present invention will be described below with reference to FIG. 2 to FIG. 5.

[Display Device 10A]

Figure 2A:
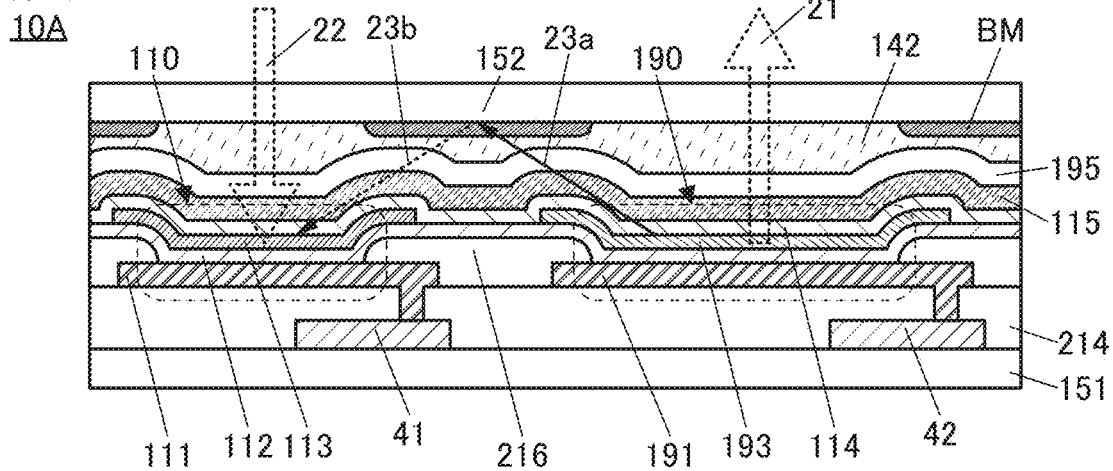
FIG. 2A, FIG. 2B, and FIG. 2C are each a cross-sectional view illustrating an example of a display device.

FIG. 2A shows a cross section of a display device 10A.

The display device 10A includes a light-receiving element 110 and a light-emitting element 190.

The light-receiving element 110 includes a pixel electrode 111, a common layer 112, an active layer 113, a common layer 114, and a common electrode 115.

The light-emitting element 190 includes a pixel electrode 191, the common layer 112, a light-emitting layer 193, the common layer 114, and the common electrode 115.

The pixel electrode 111, the pixel electrode 191, the common layer 112, the active layer 113, the light-emitting layer 193, the common layer 114, and the common electrode 115 may each have a single-layer structure or a stacked-layer structure.

The pixel electrode 111 and the pixel electrode 191 are positioned over an insulating layer 214. The pixel electrode 111 and the pixel electrode 191 can be formed using the same material in the same step.

The common layer 112 is positioned over the pixel electrode 111 and the pixel electrode 191. The common layer 112 is shared by the light-receiving element 110 and the light-emitting element 190.

The active layer 113 overlaps with the pixel electrode 111 with the common layer 112 therebetween. The light-emitting layer 193 overlaps with the pixel electrode 191 with the common layer 112 therebetween. The active layer 113 contains a first organic compound, and the light-emitting layer 193 contains a second organic compound that is different from the first organic compound.

The common layer 114 is positioned over the common layer 112, the active layer 113, and the light-emitting layer 193. The common layer 114 is shared by the light-receiving element 110 and the light-emitting element 190.

The common electrode 115 includes a portion overlapping with the pixel electrode 111 with the common layer 112, the active layer 113, and the common layer 114 therebetween. The common electrode 115 further includes a portion overlapping with the pixel electrode 191 with the common layer 112, the light-emitting layer 193, and the common layer 114 therebetween. The common electrode 115 is shared by the light-receiving element 110 and the light-emitting element 190.

In the display device of this embodiment, an organic compound is used for the active layer 113 of the light-receiving element 110. The light-receiving element 110 can have such a structure that the layers other than the active layer 113 are shared with the light-emitting element 190 (the EL element). Therefore, the light-receiving element 110 can be formed concurrently with the formation of the light-emitting element 190 only by adding a step of depositing the active layer 113 in the manufacturing process of the light-emitting element 190. The light-emitting element 190 and the light-receiving element 110 can be formed over one substrate. Accordingly, the light-receiving element 110 can be incorporated into the display device without a significant increase in the number of manufacturing steps.

The display device 10A shows an example in which the light-receiving element 110 and the light-emitting element 190 have a common structure except that the active layer 113 of the light-receiving element 110 and the light-emitting layer 193 of the light-emitting element 190 are separately formed. Note that the structures of the light-receiving element 110 and the light-emitting element 190 are not limited thereto. The light-receiving element 110 and the light-emitting element 190 may include separately formed layers other than the active layer 113 and the light-emitting layer 193 (see display devices 10K, 10L, and 10M described later). The light-receiving element 110 and the light-emitting element 190 preferably include at least one layer used in common (common layer). Thus, the light-receiving element 110 can be incorporated into the display device without a significant increase in the number of manufacturing steps.

The display device 10A includes the light-receiving element 110, the light-emitting element 190, a transistor 41, a transistor 42, and the like between a pair of substrates (a substrate 151 and a substrate 152).

In the light-receiving element 110, the common layer 112, the active layer 113, and the common layer 114, which are positioned between the pixel electrode 111 and the common electrode 115, can each be referred to as an organic layer (a layer containing an organic compound). The pixel electrode 111 preferably has a function of reflecting visible light. An end portion of the pixel electrode 111 is covered with a bank 216. The common electrode 115 has a function of transmitting visible light.

The light-receiving element 110 has a function of sensing light. Specifically, the light-receiving element 110 is a photoelectric conversion device that receives light 22 incident from the outside of the display device 10A and converts the light 22 into an electric signal. The light 22 can also be expressed as light that is emitted by the light-emitting element 190 and then reflected by an object. The light 22 may enter the light-receiving element 110 through a lens described later. The description in this embodiment is made so that the pixel electrode 111 functions as an anode and the common electrode 115 functions as a cathode to match the electrodes of the light-emitting element 190. In other words, the light-receiving element 110 is driven by application of reverse bias between the pixel electrode 111 and the common electrode 115, so that light incident on the light-receiving element 110 can be sensed and electric charge can be generated.

A light-blocking layer BM is provided on a surface of the substrate 152 facing the substrate 151. The light-blocking layer BM has an opening at a position overlapping with the light-receiving element 110 and an opening at a position overlapping with the light-emitting element 190. Providing the light-blocking layer BM can control the range where the light-receiving element 110 senses light.

For the light-blocking layer BM, a material that blocks light emitted from the light-emitting element can be used. The light-blocking layer BM preferably absorbs visible light. As the light-blocking layer BM, a black matrix can be formed using a metal material or a resin material containing pigment (e.g., carbon black) or dye, for example. The light-blocking layer BM may have a stacked-layer structure of a red color filter, a green color filter, and a blue color filter.

Here, the light-receiving element 110 senses light that is emitted by the light-emitting element 190 and then reflected by an object. However, in some cases, light emitted from the light-emitting element 190 is reflected inside the display device 10A and enters the light-receiving element 110 without via an object, in some cases. The light-blocking layer BM can reduce the influence of such stray light. For example, in the case where the light-blocking layer BM is not provided, light 23a emitted from the light-emitting element 190 is reflected by the substrate 152 and reflected light 23b is incident on the light-receiving element 110 in some cases. Providing the light-blocking layer BM can inhibit entry of the reflected light 23b into the light-receiving element 110. Consequently, noise can be reduced, and the sensitivity of a sensor using the light-receiving element 110 can be increased.

In the light-emitting element 190, the common layer 112, the light-emitting layer 193, and the common layer 114, which are positioned between the pixel electrode 191 and the common electrode 115, can each be referred to as an EL layer. The pixel electrode 191 preferably has a function of reflecting visible light. An end portion of the pixel electrode 191 is covered with the bank 216. The pixel electrode 111 and the pixel electrode 191 are electrically insulated from each other by the bank 216. The common electrode 115 has a function of transmitting visible light.

The light-emitting element 190 has a function of emitting visible light. Specifically, the light-emitting element 190 is an electroluminescent element that emits light (see light emission 21) to the substrate 152 side by applying voltage between the pixel electrode 191 and the common electrode 115.

It is preferable that the light-emitting layer 193 be formed not to overlap with a light-receiving region of the light-receiving element 110. Accordingly, it is possible to inhibit the light-emitting layer 193 from absorbing the light 22, so that the amount of light with which the light-receiving element 110 is irradiated can be increased.

The pixel electrode 111 is electrically connected to a source or a drain of the transistor 41 through an opening provided in the insulating layer 214. The end portion of the pixel electrode 111 is covered with the bank 216.

The pixel electrode 191 is electrically connected to a source or a drain of the transistor 42 through an opening provided in the insulating layer 214. The end portion of the electrode 191 is covered with the bank 216. The transistor 42 has a function of controlling the driving of the light-emitting element 190.

The transistor 41 and the transistor 42 are on and in contact with the same layer (the substrate 151 in FIG. 2A).

At least part of a circuit electrically connected to the light-receiving element 110 is preferably formed using the same material in the same steps as a circuit electrically connected to the light-emitting element 190. In that case, the thickness of the display device can be smaller than that in the case where the two circuits are formed on different planes, and the manufacturing steps can be simplified.

The light-receiving element 110 and the light-emitting element 190 are preferably covered with a protective layer 195. In FIG. 2A, the protective layer 195 is provided on and in contact with the common electrode 115. Providing the protective layer 195 can inhibit entry of impurities such as water into the light-receiving element 110 and the light-emitting element 190, so that the reliability of the light-receiving element 110 and the light-emitting element 190 can be increased. The protective layer 195 and the substrate 152 are attached to each other with an adhesive layer 142.

Figure 3A:
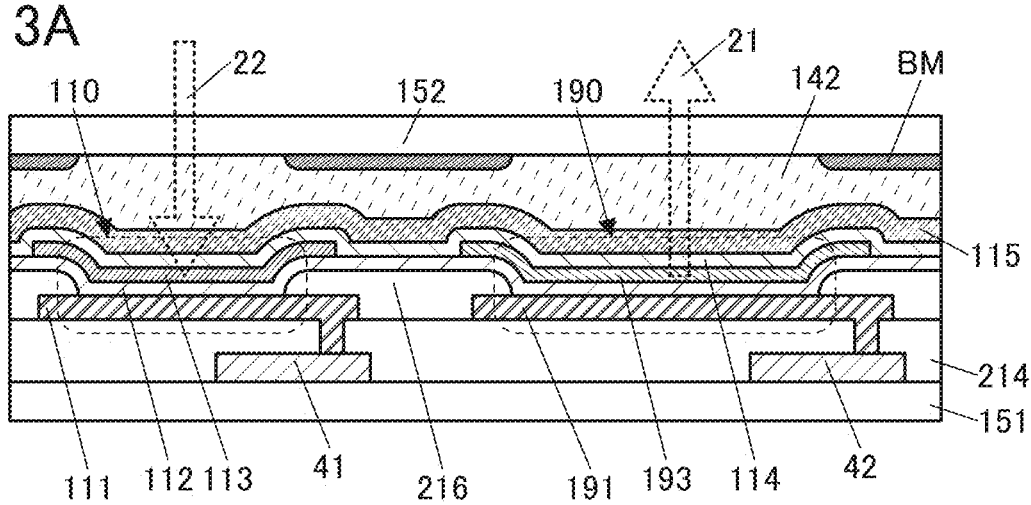
FIG. 3A, FIG. 3B, and FIG. 3C are each a cross-sectional view illustrating an example of a display device.

Note that as shown in FIG. 3A, the protective layer is not necessarily provided over the light-receiving element 110 and the light-emitting element 190. In FIG. 3A, the common electrode 115 and the substrate 152 are attached to each other with the adhesive layer 142.

[Display Device 10B]

Figure 2B:
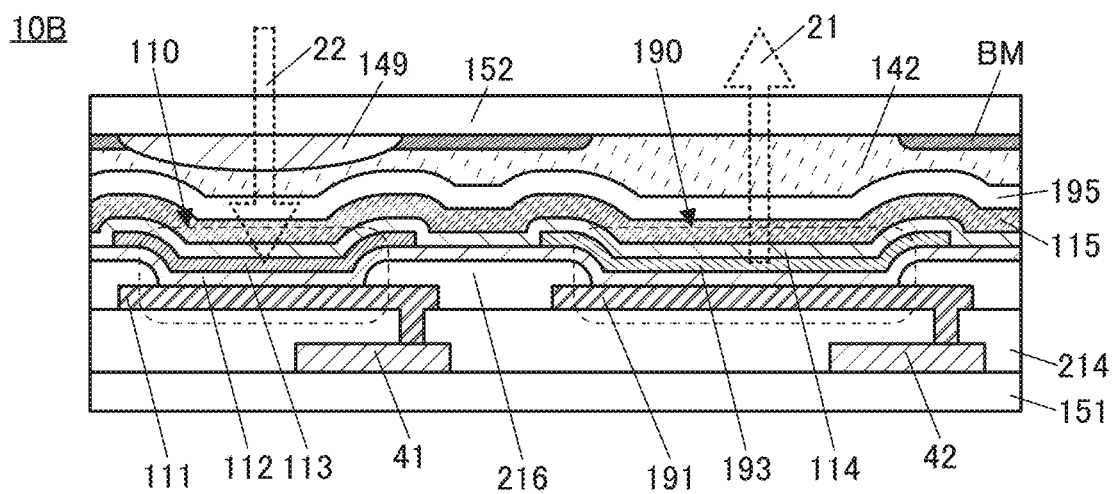

FIG. 2B shows a cross section of a display device 10B. Note that in the description of the display device below, components similar to those of the above-mentioned display device are not described in some cases.

The display device 10B illustrated in FIG. 2B includes a lens 149 in addition to the components of the display device 10A.

The display device of this embodiment may include the lens 149. The lens 149 is provided at a position overlapping with the light-receiving element 110. In the display device 10B, the lens 149 is provided in contact with the substrate 152. The lens 149 included in the display device 10B has a convex surface facing the substrate 151. Alternatively, the lens 149 may have a convex surface facing the substrate 152.

In the case where the light-blocking layer BM and the lens 149 are formed on the same plane of the substrate 152, their formation order is not limited. FIG. 2B shows an example in which the lens 149 is formed first; alternatively, the light-blocking layer BM may be formed first. In FIG. 2B, an end portion of the lens 149 is covered with the light-blocking layer BM.

In the display device 10B, the light 22 is incident on the light-receiving element 110 through the lens 149. With the lens 149, the imaging range of the light-receiving element 110 can be narrowed as compared to the case where the lens 149 is not provided, thereby inhibiting overlap of the imaging ranges between the adjacent light-receiving elements 110. Thus, a clear image with little blurring can be captured. Given that the imaging range of the light-receiving element 110 does not change, the lens 149 allows the size of a pinhole (corresponding to the size of an opening in BM that overlaps with the light-receiving element 110 in FIG. 2B) to be increased, compared to the case where the lens 149 is not provided. Hence, providing the lens 149 can increase the amount of light entering the light-receiving element 110.

Figure 3B:
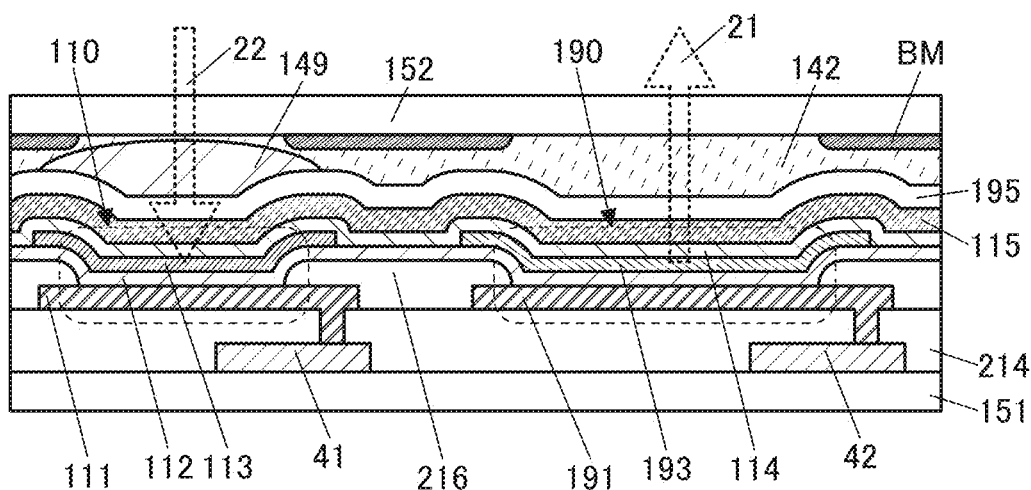
Figure 3C:
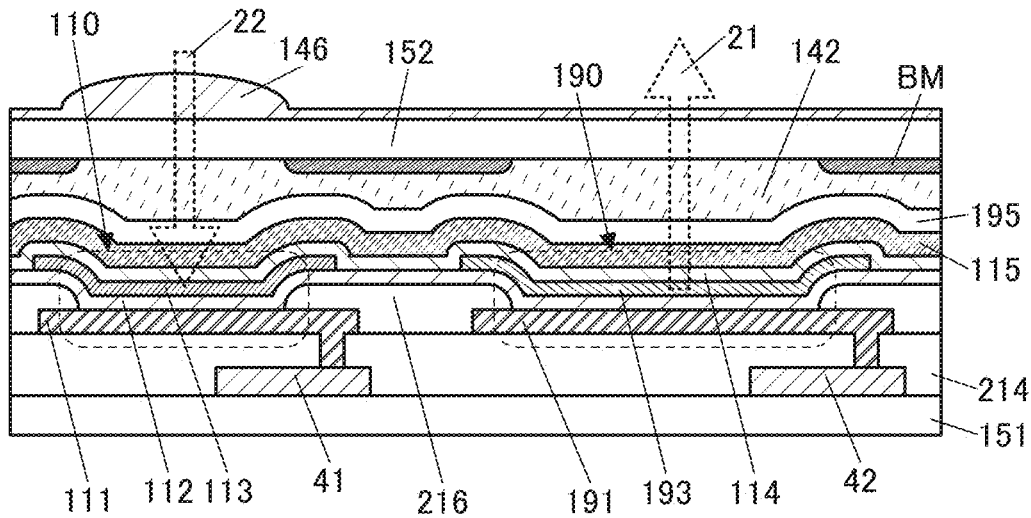

Each of display devices illustrated in FIG. 3B and FIG. 3C has a structure in which the light 22 enters the light-receiving element 110 through the lens 149, in a manner similar to that of the display device 10B illustrated in FIG. 2B.

In FIG. 3B, the lens 149 is provided in contact with a top surface of the protective layer 195. The lens 149 included in the display device illustrated in FIG. 3B has a convex surface facing the substrate 152.

In the display device illustrated in FIG. 3C, a lens array 146 is provided on the display surface side of the substrate 152. A lens included in the lens array 146 is provided at a position overlapping with the light-receiving element 110. The light-blocking layer BM is preferably provided on a surface of the substrate 152 facing the substrate 151.

As a method for forming the lens used in the display device of this embodiment, a lens such as a microlens may be formed directly over the substrate or the light-receiving element, or a lens array formed separately, such as a microlens array, may be attached to the substrate.

[Display Device 10C]

Figure 2C:
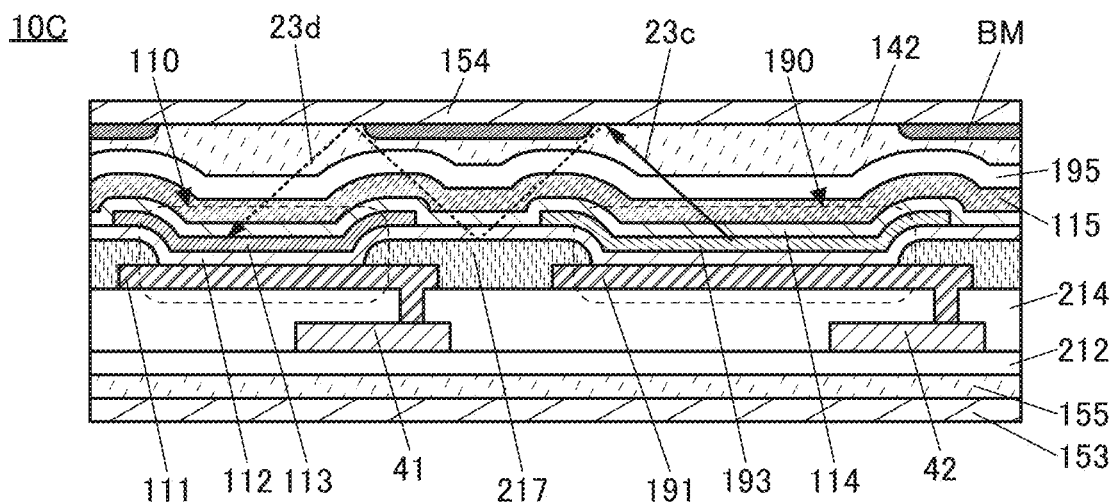

FIG. 2C shows a cross section of a display device 10C.

The display device 10C illustrated in FIG. 2C differs from the display device 10A in that the substrate 151, the substrate 152, and the bank 216 are not included but a substrate 153, a substrate 154, an adhesive layer 155, an insulating layer 212, and a bank 217 are included.

The substrate 153 and the insulating layer 212 are attached to each other with the adhesive layer 155. The substrate 154 and the protective layer 195 are attached to each other with the adhesive layer 142.

The display device 10C is formed in such a manner that the insulating layer 212, the transistor 41, the transistor 42, the light-receiving element 110, the light-emitting element 190, and the like, which are formed over a formation substrate, are transferred onto the substrate 153. The substrate 153 and the substrate 154 are preferably flexible. Accordingly, the flexibility of the display device 10C can be increased. For example, a resin is preferably used for each of the substrate 153 and the substrate 154.

For each of the substrate 153 and the substrate 154, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyether sulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used, for example. Glass that is thin enough to have flexibility may be used for one or both of the substrate 153 and the substrate 154.

As the substrate included in the display device of this embodiment, a film having high optical isotropy may be used. Examples of a highly optically isotropic film include a triacetyl cellulose (TAC, also referred to as cellulose triacetate) film, a cycloolefin polymer (COP) film, a cycloolefin copolymer (COC) film, and an acrylic film.

The bank 217 preferably absorbs light emitted from the light-emitting element. As the bank 217, a black matrix can be formed using a resin material containing a pigment or dye, for example. Moreover, the bank 217 can be formed of a colored insulating layer by using a brown resist material.

In some cases, light 23c emitted from the light-emitting element 190 is reflected by the substrate 154 and the bank 217 and reflected light 23d is incident on the light-receiving element 110, in some cases. In other cases, the light 23c passes through the bank 217 and is reflected by a transistor, a wiring, or the like, and thus reflected light is incident on the light-receiving element 110 in some cases. When the bank 217 absorbs the light 23c, the reflected light 23d can be inhibited from being incident on the light-receiving element 110. Consequently, noise can be reduced, and the sensitivity of a sensor using the light-receiving element 110 can be increased.

The bank 217 preferably absorbs at least light having a wavelength that is sensed by the light-receiving element 110. For example, in the case where the light-receiving element 110 senses green light emitted from the light-emitting element 190, the bank 217 preferably absorbs at least green light. For example, when the bank 217 includes a red color filter, the bank 217 can absorb the green light 23c and thus the reflected light 23d can be inhibited from being incident on the light-receiving element 110.

[Display Device 10D]

Figure 4A:
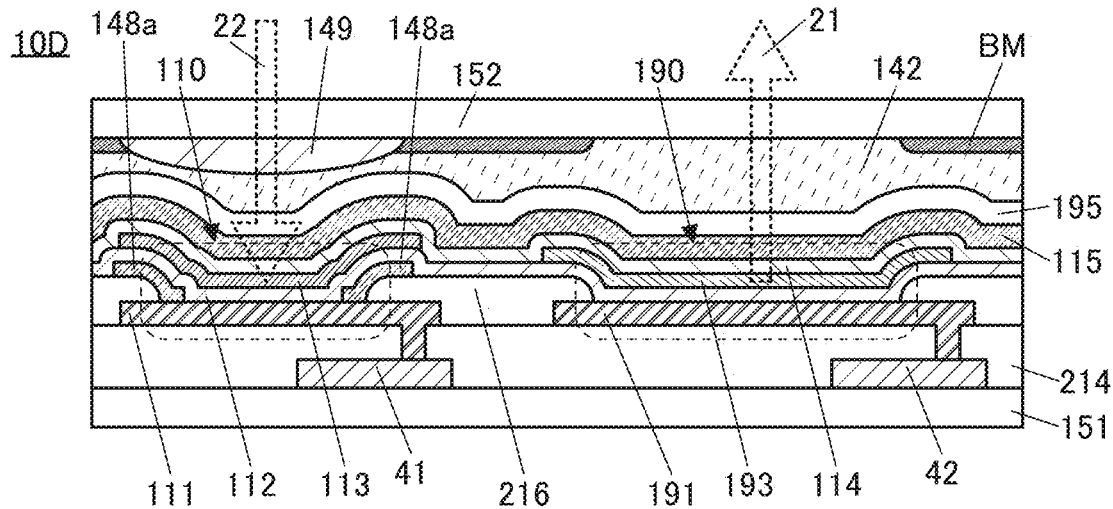
FIG. 4A, FIG. 4B, and FIG. 4C are each a cross-sectional view illustrating an example of a display device.

FIG. 4A shows a cross section of a display device 10D.

The display device 10D includes a colored layer 148a in addition to the components of the display unit 10B.

The colored layer 148a includes a portion in contact with a top surface of the pixel electrode 111 in the light-receiving element 110 and a portion in contact with a side surface of the bank 216.

The colored layer 148a preferably absorbs light emitted by the light-emitting element. As the colored layer 148a, a black matrix can be formed using a resin material containing a pigment or dye, for example. Moreover, the colored layer 148a can be formed of a colored insulating layer by using a brown resist material.

The colored layer 148a preferably absorbs at least light having a wavelength that is sensed by the light-receiving element 110. For example, in the case where the light-receiving element 110 senses green light emitted from the light-emitting element 190, the colored layer 148a preferably absorbs at least green light. For example, when including a red color filter, the colored layer 148a can absorb green light, and thus reflected light can be inhibited from entering the light-receiving element 110.

When the colored layer 148a absorbs stray light generated in the display device 10D, the amount of stray light entering the light-receiving element 110 can be reduced. Consequently, noise can be reduced, and the sensitivity of a sensor using the light-receiving element 110 can be increased.

In the display device of this embodiment, the colored layer is provided between the light-receiving element 110 and the light-emitting element 190. This can inhibit stray light from entering the light-receiving element 110 from the light-emitting element 190.

[Display Device 10E]

Figure 4B:
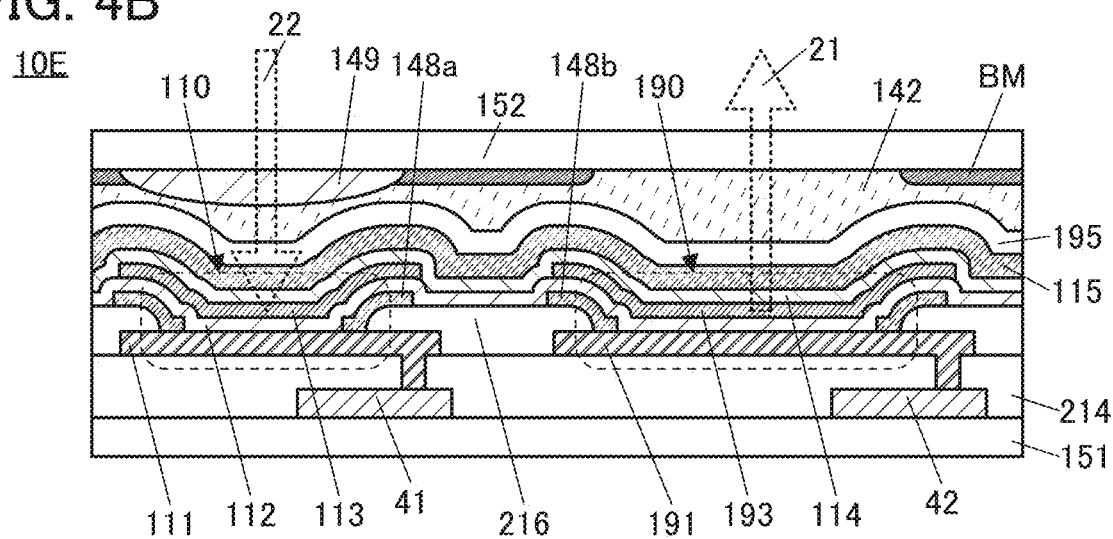

FIG. 4B shows a cross section of a display device 10E.

The display device 10E includes a colored layer 148b in addition to the components of the display device 10D. A material that can be used for the colored layer 148b is the same as that used for the colored layer 148a.

The colored layer 148b includes a portion in contact with a top surface of the pixel electrode 191 in the light-emitting element 190 and a portion in contact with a side surface of the bank 216.

The display device of this embodiment preferably includes one or both of the colored layer 148a and the colored layer 148b.

With both the colored layer 148a and the colored layer 148b, the amount of stray light entering the light-receiving element 110 can be further reduced.

Note that in the display device 10E, the colored layer 148b is in contact with a top surface of the pixel electrode 191; thus, the amount of light 21 that is emitted from the light-emitting element 190 and extracted to the outside of the display device 10E is smaller than that in the case of the display device 10D (FIG. 4A) in some cases. Therefore, in the case where only one of the colored layer 148a and the colored layer 148b is provided, only the colored layer 148a is preferably provided on the light-receiving element 110 side as in the display device 10D. This can increase the light extraction efficiency of the light-emitting element 190 and inhibits entry of stray light into the light-receiving element 110. Consequently, a highly sensitive sensor can be incorporated in a display device with high display quality.

[Display Device 10F]

Figure 4C:
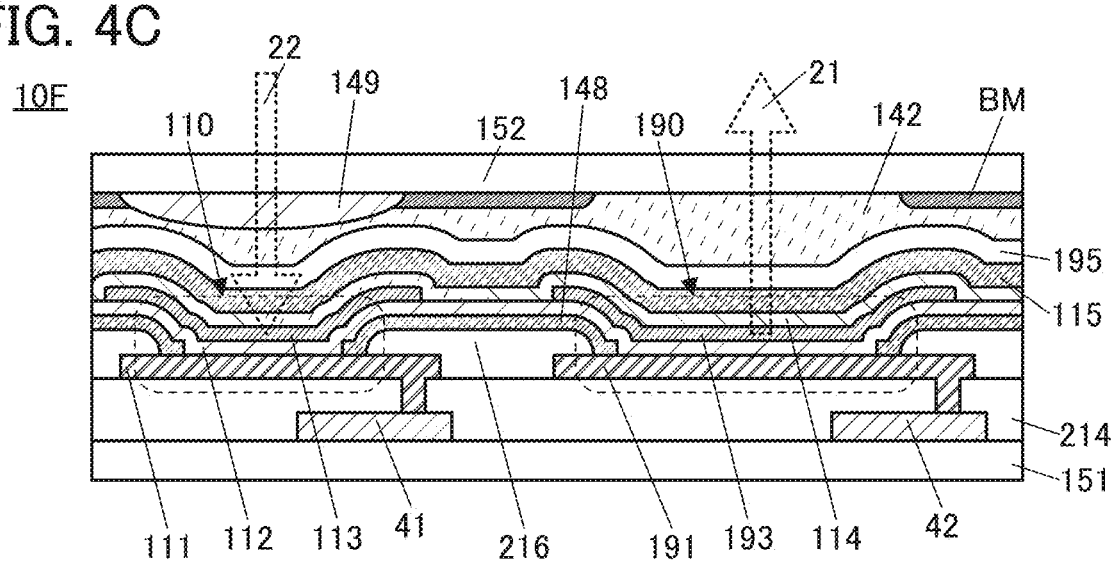

FIG. 4C shows a cross section of a display device 10F.

The display device 10F includes a colored layer 148 in addition to the components of the display device 10B. A material that can be used for the colored layer 148 is the same as that used for the colored layer 148a.

The colored layer 148 is provided to cover a top surface and a side surface of the bank 216. The colored layer 148 includes a portion in contact with a top surface of the pixel electrode 111 in the light-emitting element 110 and a portion in contact with a top surface of the pixel electrode 191 in the light-emitting element 190.

It is not necessary that the colored layer 148a and the colored layer 148b shown in FIG. 4B are isolated from each other, and they may be one film as the colored layer 148 as shown in FIG. 4C. When the colored layer 148 absorbs stray light generated in the display device 10F, the amount of stray light entering the light-receiving element 110 can be reduced. Consequently, noise can be reduced, and the sensitivity of a sensor using the light-receiving element 110 can be increased.

[Display Device 10G]

Figure 5A:
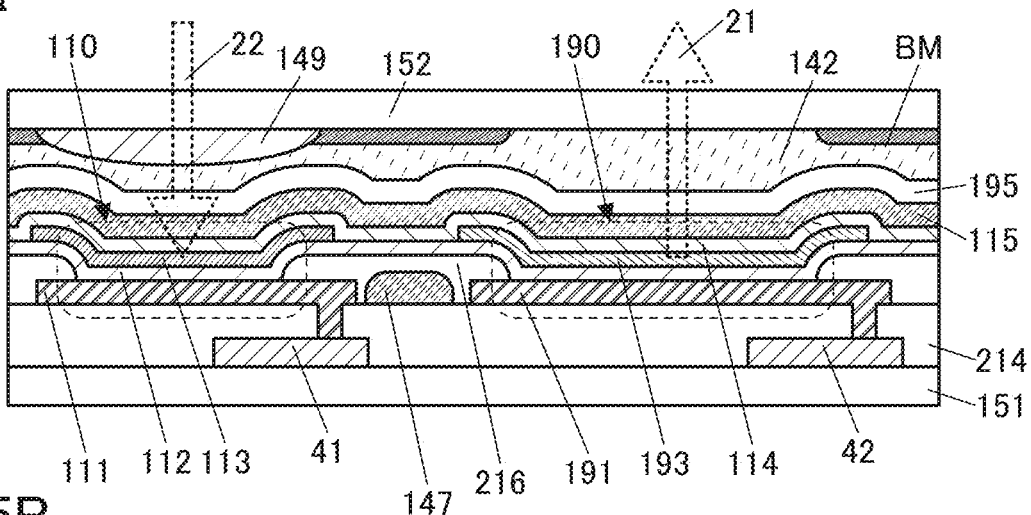
FIG. 5A, FIG. 5B, and FIG. 5C are each a cross-sectional view illustrating an example of a display device.

FIG. 5A shows a cross section of a display device 10G.

The display device 10G includes a colored layer 147 in addition to the components of the display device 10B.

The colored layer 147 is positioned over the insulating layer 214, and the bank 216 covers a top surface and a side surface of the colored layer 147. The colored layer 147 and the light-receiving element 110 are electrically isolated from each other with the bank 216. In a similar manner, the colored layer 147 and the light-emitting element 190 are electrically isolated from each other with the bank 216.

A material that can be used for the colored layer 147 is the same as that used for the colored layer 148a. As in the above-described cases of the colored layers 148, 148a, and 148b, the colored layer 147 absorbs stray light generated in the display device 10G, whereby the amount of stray light entering the light-receiving element 110 can be reduced. Consequently, noise can be reduced, and the sensitivity of a sensor using the light-receiving element 110 can be increased.

The above-described colored layers 148, 148a, and 148b may have lower resistivity than the bank 216, depending on materials thereof, because the colored layers are formed to absorb light. For example, the resistivity of a resin containing a pigment such as carbon is lower than that of a resin not containing the pigment. Thus, when any of the colored layers 148, 148a, and 148b is provided, current leakage may occur in an adjacent light-emitting element or light-emitting element. For example, current leaking to an adjacent light-emitting element causes a problem in that an undesired light-emitting element emits light (the problem is also referred to as cross-talk).

Meanwhile, the colored layer 147 is provided apart from each of the light-receiving element 110 and the light-emitting element 190. The colored layer 147 is electrically isolated from each of the light-receiving element 110 and the light-emitting element 190 with the bank 216. Thus, even when the colored layer 147 has low resistivity, the light-emitting element 110 and the light-emitting element 190 are less likely to be affected by the colored layer, which is preferable because the range of choices for materials used in the colored layer 147 is widened. A black matrix may be formed using a metal material or the like, for example, as the colored layer 147.

[Display Device 10H]

Figure 5B:
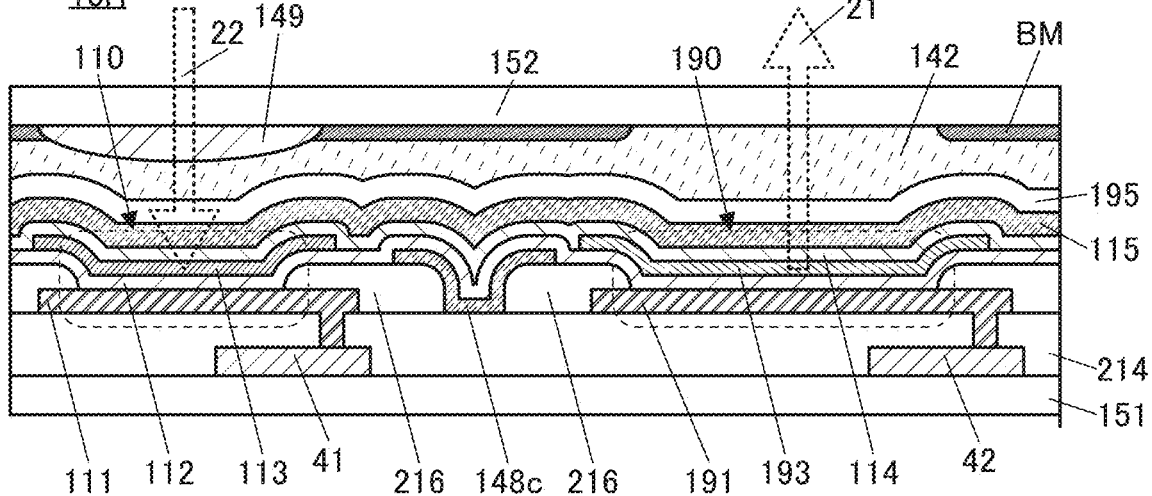

FIG. 5B shows a cross section of a display device 10H.

The display device 10H includes a colored layer 148c in addition to the components of the display device 10B.

In the display device 10H, the bank 216 has an opening reaching the insulating layer 214. The colored layer 148c includes a portion in contact with the insulating layer 214 through the opening, a portion in contact with a side surface of the bank 216 inside the opening, and a portion in contact with a top surface of the bank 216. The colored layer 148c and the light-receiving element 110 are electrically isolated from each other with the bank 216. In a similar manner, the colored layer 148c and the light-emitting element 190 are electrically isolated from each other with the bank 216.

A material that can be used for the colored layer 148c is the same as that of the colored layer 147. When the colored layer 148c absorbs stray light generated in the display device 10H, the amount of stray light entering the light-receiving element 110 can be reduced. Consequently, noise can be reduced, and the sensitivity of a sensor using the light-receiving element 110 can be increased.

The colored layer 148c is provided apart from each of the light-receiving element 110 and the light-emitting element 190. In addition, the colored layer 148c is electrically isolated from each of the light-receiving element 110 and the light-emitting element 190 with the bank 216. Thus, even when the colored layer 148c has low resistivity, the light-emitting element 110 and the light-emitting element 190 are less likely to be affected by the colored layer, which is preferable because the range of choices for materials used for the colored layer 148c is widened.

[Display Device 10J]

Figure 5C:
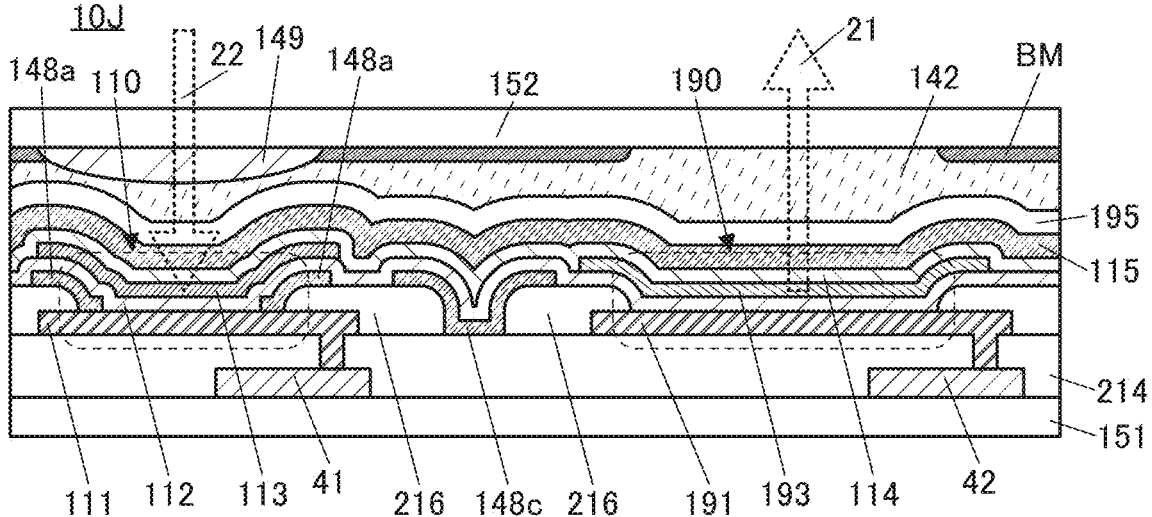

FIG. 5C shows a cross section of a display device 10J.

The display device 10J includes a colored layer 148c in addition to the components of the display device 10D.

As illustrated in FIG. 4A to FIG. 4C and FIG. 5A to FIG. 5C, the display device of one embodiment of the present invention preferably includes one or more of the colored layers 148, 148a, 148b, 148c, and 147. This enables absorption of stray light generated in the display device and reduction of the amount of stray light entering the light-receiving element 110. Consequently, noise can be reduced, and the sensitivity of a sensor using the light-receiving element 110 can be increased.

[Display Devices 10K, 10L, 10M]

Figure 6A:
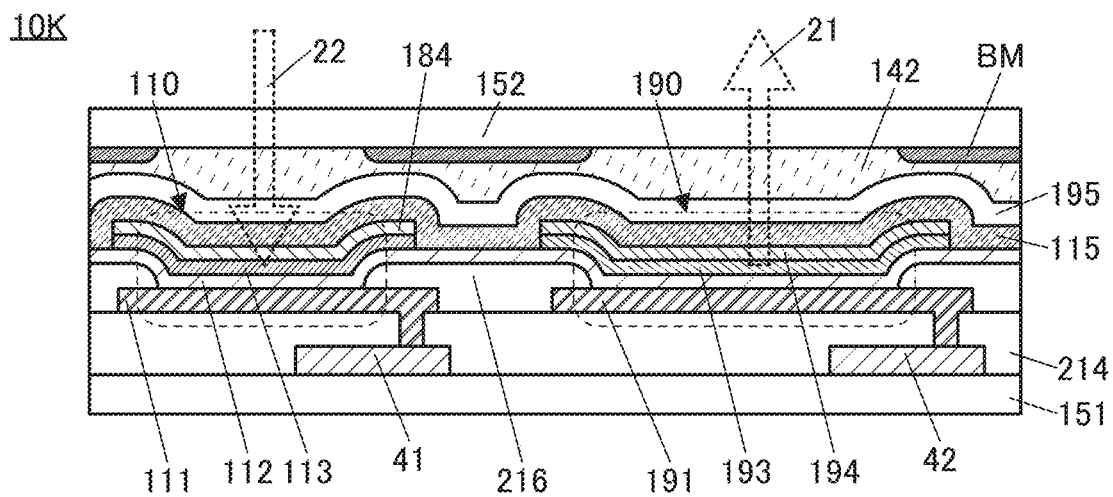
FIG. 6A, FIG. 6B, and FIG. 6C are each a cross-sectional view illustrating an example of a display device.
Figure 6B:
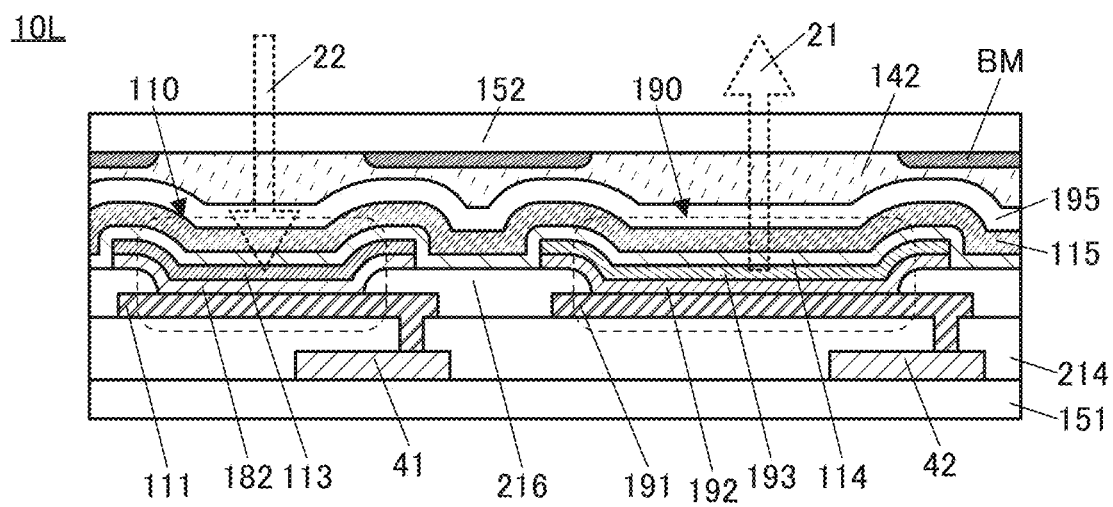
Figure 6C:
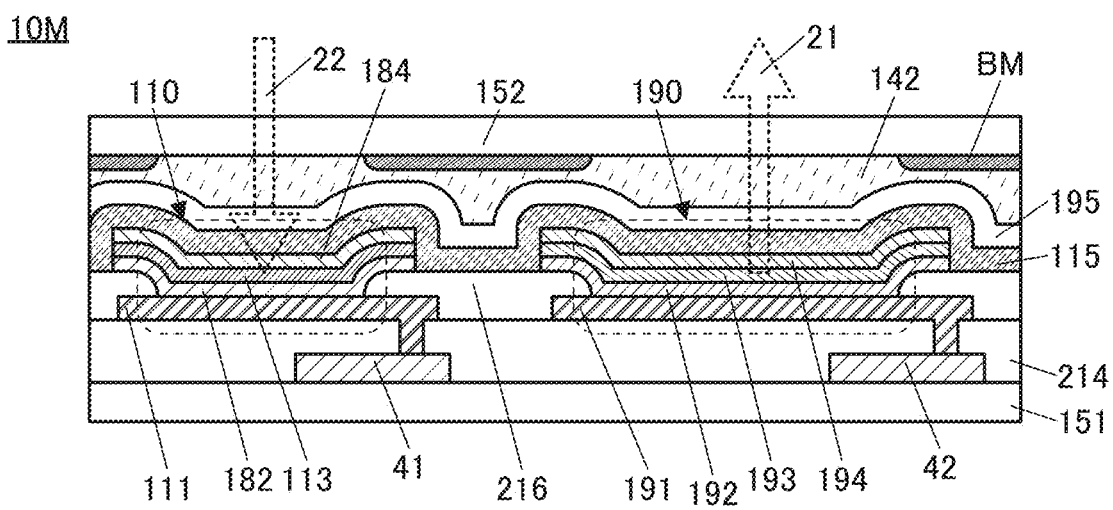

FIG. 6A shows a cross section of a display device 10K, FIG. 6B shows a cross section of a display device 10L, and FIG. 6C shows a cross section of a display device 10M.

The display device 10K differs from the display device 10A in that the common layer 114 is not included and a buffer layer 184 and a buffer layer 194 are included. The buffer layer 184 and the buffer layer 194 may each have a single-layer structure or a stacked-layer structure.

In the display device 10K, the light-receiving element 110 includes the pixel electrode 111, the common layer 112, the active layer 113, the buffer layer 184, and the common electrode 115. In the display device 10K, the light-emitting element 190 includes the pixel electrode 191, the common layer 112, the light-emitting layer 193, the buffer layer 194, and the common electrode 115.

The display device 10L differs from the display device 10A in that the common layer 112 is not included and a buffer layer 182 and a buffer layer 192 are included. The buffer layer 182 and the buffer layer 192 may each have a single-layer structure or a stacked-layer structure.

In the display device 10L, the light-receiving element 110 includes the pixel electrode 111, the buffer layer 182, the active layer 113, the common layer 114, and the common electrode 115. In the display device 10L, the light-emitting element 190 includes the pixel electrode 191, the buffer layer 192, the light-emitting layer 193, the common layer 114, and the common electrode 115.

The display device 10M differs from the display device 10A in that the common layer 112 and the common layer 114 are not included and the buffer layers 182, 184, 192, and 194 are included.

In the display device 10M, the light-receiving element 110 includes the pixel electrode 111, the buffer layer 182, the active layer 113, the buffer layer 184, and the common electrode 115. In the display device 10M, the light-emitting element 190 includes the pixel electrode 191, the buffer layer 192, the light-emitting layer 193, the buffer layer 194, and the common electrode 115.

Other layers as well as the active layer 113 and the light-emitting layer 193 can be formed separately when the light-receiving element 110 and the light-emitting element 190 are manufactured.

The display device 10K shows an example in which the buffer layer 184 between the common electrode 115 and the active layer 113 and the buffer layer 194 between the common electrode 115 and the light-emitting layer 193 are formed separately. As the buffer layer 184, for example, an electron-transport layer can be formed. As the buffer layer 194, one or both of an electron-injection layer and an electron-transport layer can be formed, for example.

The display device 10L shows an example in which the buffer layer 182 between the pixel electrode 111 and the active layer 113 and the buffer layer 192 between the pixel electrode 191 and the light-emitting layer 193 are formed separately. As the buffer layer 182, for example, a hole-transport layer can be formed. As the buffer layer 192, one or both of a hole-injection layer and a hole-transport layer can be formed, for example.

The display device 10M shows an example in which in each of the light-receiving element 110 and the light-emitting element 190, a common layer is not provided between the pair of electrodes (the pixel electrode 111 or 191 and the common electrode 115). The light-receiving element 110 and the light-emitting element 190 included in the display device 10M can be manufactured in the following manner: the pixel electrode 111 and the pixel electrode 191 are formed over the insulating layer 214 using the same material in the same step; the buffer layer 182, the active layer 113, and the buffer layer 184 are formed over the pixel electrode 111; the buffer layer 192, the light-emitting layer 193, and the buffer layer 194 are formed over the pixel electrode 191; and then, the common electrode 115 is formed to cover the pixel electrode 111, the buffer layer 182, the active layer 113, the buffer layer 184, the pixel electrode 191, the buffer layer 192, the light-emitting layer 193, and the buffer layer 194. Note that the manufacturing order of the stacked-layer structure of the buffer layer 182, the active layer 113, and the buffer layer 184 and the stacked-layer structure of the buffer layer 192, the light-emitting layer 193, and the buffer layer 194 is not particularly limited. For example, after the buffer layer 182, the active layer 113, and the buffer layer 184 are deposited, the buffer layer 192, the light-emitting layer 193, and the buffer layer 194 may be deposited. In contrast, the buffer layer 192, the light-emitting layer 193, and the buffer layer 194 may be deposited before the buffer layer 182, the active layer 113, and the buffer layer 184 are deposited. Alternatively, the buffer layer 182, the buffer layer 192, the active layer 113, and the light-emitting layer 193 may be deposited in that order, for example.

A more detailed structure of the display device of one embodiment of the present invention will be described below with reference to FIG. 7 to FIG. 11.

[Display Device 100A]

Figure 7:
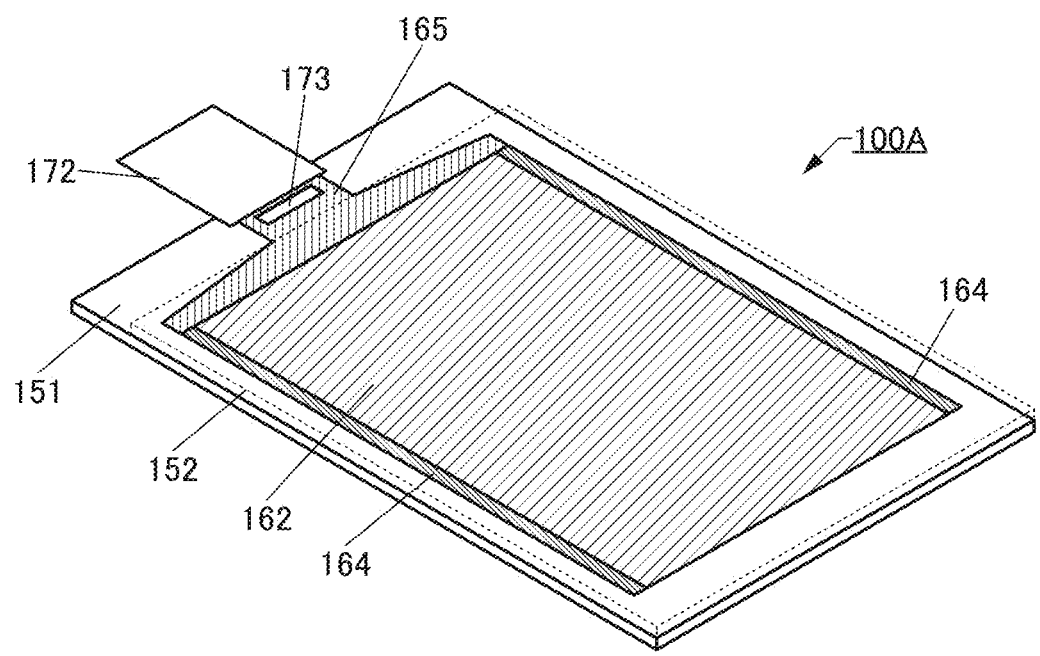
FIG. 7 is a perspective view illustrating an example of a display device.
Figure 8:
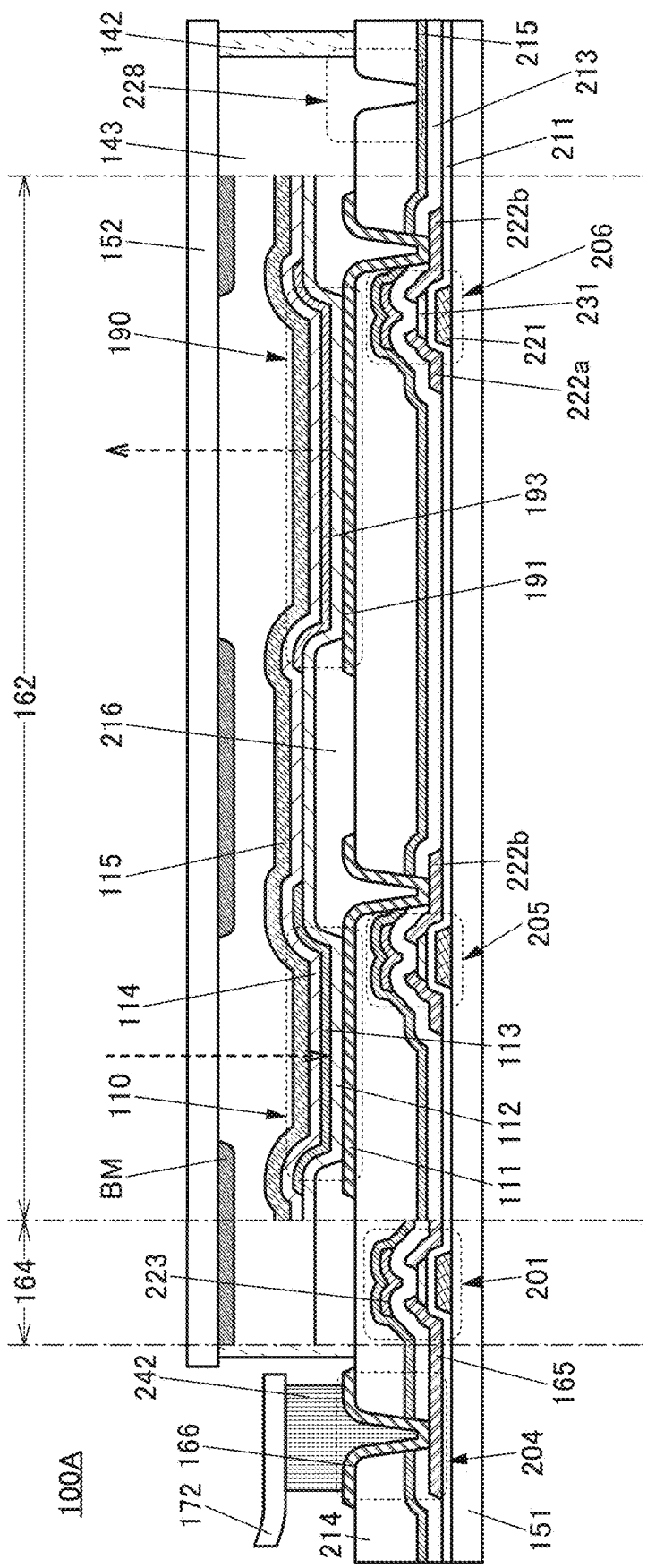
FIG. 8 is a cross-sectional view illustrating an example of a display device.

FIG. 7 is a perspective view of a display device 100A, and FIG. 8 is a cross-sectional view of the display device 100A.

The display device 100A has a structure in which the substrate 152 and the substrate 151 are bonded to each other. In FIG. 7, the substrate 152 is denoted by a dashed line.

The display device 100A includes a display portion 162, a circuit 164, a wiring 165, and the like. FIG. 7 illustrates an example in which the display device 100A is provided with an IC (integrated circuit) 173 and an FPC 172. Thus, the structure illustrated in FIG. 7 can be regarded as a display module including the display device 100A, the IC, and the FPC.

As the circuit 164, for example, a scan line driver circuit can be used.

The wiring 165 has a function of supplying a signal and power to the display portion 162 and the circuit 164. The signal and power are input to the wiring 165 from the outside through the FPC 172 or from the IC 173.

FIG. 7 illustrates an example in which the IC 173 is provided over the substrate 151 by a COG (Chip On Glass) method, a COF (Chip on Film) method, or the like. An IC including a scan line driver circuit, a signal line driver circuit, or the like can be used as the IC 173, for example. Note that the display device 100A and the display module may have a structure that is not provided with an IC. The IC may be implemented on the FPC by a COF method or the like.

FIG. 8 illustrates an example of a cross section including part of a region including the FPC 172, part of a region including the circuit 164, part of a region including the display portion 162, and part of a region including an end portion of the display device 100A illustrated in FIG. 7.

The display device 100A in FIG. 8 includes a transistor 201, a transistor 205, a transistor 206, the light-emitting element 190, the light-receiving element 110, and the like between the substrate 151 and the substrate 152.

The substrate 152 and the insulating layer 214 are bonded to each other with an adhesive layer 142. A solid sealing structure, a hollow sealing structure, or the like can be employed to seal the light-emitting element 190 and the light-receiving element 110. In FIG. 8, a hollow sealing structure is employed in which a space 143 surrounded by the substrate 152, the adhesive layer 142, and the insulating layer 214 is filled with an inert gas (e.g., nitrogen or argon). The adhesive layer 142 may overlap with the light-emitting element 190. The space 143 surrounded by the substrate 152, the adhesive layer 142, and the insulating layer 214 may be filled with a resin different from that of the adhesive layer 142.

The light-emitting element 190 has a stacked-layer structure in which the pixel electrode 191, the common layer 112, the light-emitting layer 193, the common layer 114, and the common electrode 115 are stacked in this order from the insulating layer 214 side. The pixel electrode 191 is connected to a conductive layer 222b included in the transistor 206 through an opening provided in the insulating layer 214. The transistor 206 has a function of controlling the driving of the light-emitting element 190. An end portion of the pixel electrode 191 is covered with the bank 216. The pixel electrode 191 includes a material that reflects visible light, and the common electrode 115 includes a material that transmits visible light.

The light-receiving element 110 has a stacked-layer structure in which the pixel electrode 111, the common layer 112, the active layer 113, the common layer 114, and the common electrode 115 are stacked in that order from the insulating layer 214 side. The pixel electrode 111 is electrically connected to the conductive layer 222b included in the transistor 205 through an opening provided in the insulating layer 214. An end portion of the pixel electrode 111 is covered with the bank 216. The pixel electrode 111 includes a material that reflects visible light, and the common electrode 115 includes a material that transmits visible light.

Light from the light-emitting element 190 is emitted toward the substrate 152. Light enters the light-receiving element 110 through the substrate 152 and the space 143. For the substrate 152, a material having a high visible-light-transmitting property is preferably used.

The pixel electrode 111 and the pixel electrode 191 can be formed using the same material in the same step. The common layer 112, the common layer 114, and the common electrode 115 are used in both the light-receiving element 110 and the light-emitting element 190. The light-receiving element 110 and the light-emitting element 190 can have common components except the active layer 113 and the light-emitting layer 193. Thus, the light-receiving element 110 can be incorporated into the display device 100A without a significant increase in the number of manufacturing steps.

A light-blocking layer BM is provided on a surface of the substrate 152, which faces the substrate 151. The light-blocking layer BM has an opening at a position overlapping with the light-receiving element 110 and an opening at a position overlapping with the light-emitting element 190. Providing the light-blocking layer BM can control the range where the light-receiving element 110 senses light. Furthermore, with the light-blocking layer BM, light can be prevented from directly entering the light-receiving element 110 from the light-emitting element 190 without passing through any object. Hence, a sensor with less noise and high sensitivity can be obtained.

The transistor 201, the transistor 205, and the transistor 206 are formed over the substrate 151. These transistors can be fabricated using the same material in the same step.

An insulating layer 211, an insulating layer 213, an insulating layer 215, and the insulating layer 214 are provided in this order over the substrate 151. Parts of the insulating layer 211 function as gate insulating layers of the transistors. Parts of the insulating layer 213 function as gate insulating layers of the transistors. The insulating layer 215 is provided to cover the transistors. The insulating layer 214 is provided to cover the transistors and has a function of a planarization layer. Note that the number of gate insulating layers and the number of insulating layers covering the transistor are not limited and either a single layer or two or more layers may be employed.

A material through which impurities such as water and hydrogen do not easily diffuse is preferably used for at least one of the insulating layers that cover the transistors. Thus, such an insulating layer can serve as a barrier layer. Such a structure can effectively inhibit diffusion of impurities into the transistors from the outside and increase the reliability of a display device.

An inorganic insulating film is preferably used as each of the insulating layers 211, 213, and 215. As the inorganic insulating film, for example, an inorganic insulating film such as a silicon nitride film, a silicon oxynitride film, a silicon oxide film, a silicon nitride oxide film, an aluminum oxide film, or an aluminum nitride film can be used. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may also be used. A stack including two or more of the above insulating films may also be used.

Here, an organic insulating film often has a lower barrier property than an inorganic insulating film. Therefore, the organic insulating film preferably has an opening in the vicinity of an end portion of the display device 100A. This can inhibit entry of impurities from the end portion of the display device 100A through the organic insulating film. Alternatively, the organic insulating film may be formed so that its end portion is positioned on the inner side compared to the end portion of the display device 100A, to prevent the organic insulating film from being exposed at the end portion of the display device 100A.

An organic insulating film is suitable for the insulating layer 214 functioning as a planarization layer. Examples of materials which can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In a region 228 illustrated in FIG. 8, an opening is formed in the insulating layer 214. This can inhibit entry of impurities into the display portion 162 from the outside through the insulating layer 214 even when an organic insulating film is used as the insulating layer 214. Consequently, the display device 100A can have higher reliability.

Each of the transistors 201, 205, and 206 includes a conductive layer 221 functioning as a gate, the insulating layer 211 functioning as the gate insulating layer, a conductive layer 222a and the conductive layer 222b functioning as a source and a drain, a semiconductor layer 231, the insulating layer 213 functioning as the gate insulating layer, a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display device of this embodiment. For example, a planar transistor, a staggered transistor, or an inverted staggered transistor can be used. A top-gate or a bottom-gate transistor structure may be employed. Alternatively, gates may be provided above and below a semiconductor layer in which a channel is formed.

The structure in which the semiconductor layer where a channel is formed is provided between two gates is used for the transistors 201, 205, and 206. The two gates may be connected to each other and supplied with the same signal to operate the transistor. Alternatively, by supplying a potential for controlling the threshold voltage to one of the two gates and a potential for driving to the other, the threshold voltage of the transistor may be controlled.

There is no particular limitation on the crystallinity of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. A semiconductor having crystallinity is preferably used, in which case deterioration of the transistor characteristics can be suppressed.

It is preferable that a semiconductor layer of a transistor contain a metal oxide (also referred to as an oxide semiconductor). Alternatively, the semiconductor layer of the transistor may contain silicon. Examples of silicon include amorphous silicon and crystalline silicon (e.g., low-temperature polysilicon or single crystal silicon).

The semiconductor layer preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin.

It is particularly preferable to use an oxide containing indium (In), gallium (Ga), and zinc (Zn) (also referred to as IGZO) for the semiconductor layer.

In the case where the semiconductor layer is an In-M-Zn oxide, a sputtering target used for depositing the In-M-Zn oxide preferably has the atomic proportion of In higher than or equal to the atomic proportion of M. Examples of the atomic ratio of the metal elements in such a sputtering target include In:M:Zn=1:1:1, In:M:Zn=1:1:1.2, In:M:Zn=2:1:3, In:M:Zn=3:1:2, In:M:Zn=4:2:3, In:M:Zn=4:2:4.1, In:M:Zn=5:1:6, In:M:Zn=5:1:7, In:M:Zn=5:1:8, In:M:Zn=6:1:6, and In:M:Zn=5:2:5.

A target containing a polycrystalline oxide is preferably used as the sputtering target, in which case the semiconductor layer having crystallinity is easily formed. Note that the atomic ratio between metal elements in the formed semiconductor layer may vary from the above atomic ratio between metal elements in the sputtering target in a range of ±40%. For example, in the case where the composition of a sputtering target used for the semiconductor layer is In:Ga:Zn=4:2:4.1 [atomic ratio], the composition of the semiconductor layer to be formed is in some cases in the neighborhood of In:Ga:Zn=4:2:3 [atomic ratio].

Note that when the atomic ratio is described as In:Ga:Zn=4:2:3 or as being in the neighborhood thereof, the case is included where the atomic proportion of Ga is greater than or equal to 1 and less than or equal to 3 and the atomic proportion of Zn is greater than or equal to 2 and less than or equal to 4 with the atomic proportion of In being 4. When the atomic ratio is described as In:Ga:Zn=5:1:6 or as being in the neighborhood thereof, the case is included where the atomic proportion of Ga is greater than 0.1 and less than or equal to 2 and the atomic proportion of Zn is greater than or equal to 5 and less than or equal to 7 with the atomic proportion of In being 5. When the atomic ratio is described as In:Ga:Zn=1:1:1 or as being in the neighborhood thereof, the case is included where the atomic proportion of Ga is greater than 0.1 and less than or equal to 2 and the atomic proportion of Zn is greater than 0.1 and less than or equal to 2 with the atomic proportion of In being 1.

The transistor included in the circuit 164 and the transistor included in the display portion 162 may have the same structure or different structures. One structure or two or more kinds of structures may be employed for a plurality of transistors included in the circuit 164. Similarly, one structure or two or more kinds of structures may be employed for a plurality of transistors included in the display portion 162.

A connection portion 204 is provided in a region of the substrate 152 not overlapping with the substrate 151. In the connection portion 204, the wiring 165 is electrically connected to the FPC 172 via a connection layer 242 and a conductive layer 166. On the top surface of the connection portion 204, the conductive layer 166 obtained by processing the same conductive film as the pixel electrode 191 is exposed. Thus, the connection portion 204 and the FPC 172 can be electrically connected to each other through the connection layer 242.

Any of a variety of optical members can be arranged on the outer side of the substrate 152. Examples of the optical members include a polarizing plate, a retardation plate, a light diffusion layer (a diffusion film or the like), an anti-reflective layer, and a light-condensing film. Furthermore, an antistatic film preventing the attachment of dust, a water repellent film suppressing the attachment of stain, a hard coat film inhibiting generation of a scratch caused by the use, a shock absorbing layer or the like may be arranged on the outside of the substrate 152.

For each of the substrate 151 and the substrate 152, glass, quartz, ceramic, sapphire, a resin, or the like can be used. When a flexible material is used for the substrate 151 and the substrate 152, the flexibility of the display device can be increased.

As the adhesive layer, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-component resin may be used. An adhesive sheet or the like may be used.

As the connection layer 242, an anisotropic conductive film (ACF), an anisotropic conductive paste (ACP), or the like can be used.

The light-emitting element 190 may be a top emission, bottom emission, or dual emission light-emitting element, or the like. A conductive film that transmits visible light is used as the electrode through which light is extracted. A conductive film that reflects visible light is preferably used as the electrode through which no light is extracted.

The light-emitting element 190 includes at least the light-emitting layer 193. In addition to the light-emitting layer 193, the light-emitting element 190 may further include a layer containing a substance with a high hole-injection property, a layer containing a substance with a high hole-transport property, a layer containing a hole-blocking material, a layer containing a substance with a high electron-transport property, a layer containing a substance with a high electron-injection property, a layer containing a substance with a bipolar property (a substance with a high electron- and hole-transport property), or the like. For example, the common layer 112 preferably includes one or both of a hole-injection layer and a hole-transport layer. For example, the common layer 114 preferably includes one or both of an electron-transport layer and an electron-injection layer.

Either a low molecular compound or a high molecular compound can be used for the common layer 112, the light-emitting layer 193, and the common layer 114 and an inorganic compound may also be contained. The layers that constitute the common layer 112, the light-emitting layer 193, and the common layer 114 can each be formed by a method such as an evaporation method (including a vacuum evaporation method), a transfer method, a printing method, an inkjet method, or a coating method.

The light-emitting layer 193 may contain an inorganic compound such as quantum dots as a light-emitting material.

The active layer 113 of the light-receiving element 110 contains a semiconductor. Examples of the semiconductor include an inorganic semiconductor such as silicon and an organic semiconductor including an organic compound. This embodiment shows an example in which an organic semiconductor is used as the semiconductor contained in the active layer. The use of an organic semiconductor is preferable because the light-emitting layer 193 of the light-emitting element 190 and the active layer 113 of the light-receiving element 110 can be formed by the same method (e.g., a vacuum evaporation method) and thus the same manufacturing apparatus can be used.

Examples of an n-type semiconductor material included in the active layer 113 are electron-accepting organic semiconductor materials such as fullerene (e.g., $C_{60}$ and $C_{70}$) and derivatives thereof. As a p-type semiconductor material included in the active layer 113, an electron-donating organic semiconductor material such as copper(II) phthalocyanine (CuPc) or tetraphenyldibenzoperiflanthene (DBP) can be given.

For example, the active layer 113 is preferably formed by co-evaporation of an n-type semiconductor and a p-type semiconductor.

As materials that can be used for conductive layers such as a variety of wirings and electrodes that constitute a display device, in addition to a gate, a source, and a drain of a transistor; metals such as aluminum, titanium, chromium, nickel, copper, yttrium, zirconium, molybdenum, silver, tantalum, or tungsten, or an alloy containing any of these metals as its main component can be given. A film containing any of these materials can be used in a single layer or as a stacked-layer structure.

As a light-transmitting conductive material, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Further alternatively, a nitride of the metal material (e.g., titanium nitride) or the like may be used. Note that in the case of using the metal material or the alloy material (or the nitride thereof), the thickness is set small enough to be able to transmit light. A stacked-layer film of any of the above materials can be used for the conductive layers. For example, when a stacked film of indium tin oxide and an alloy of silver and magnesium, or the like is used, the conductivity can be increased, which is preferable. They can also be used for conductive layers such as a variety of wirings and electrodes that constitute a display device, and conductive layers (conductive layers functioning as a pixel electrode or a common electrode) included in a display element.

As an insulating material that can be used for each insulating layer, for example, a resin such as acrylic or epoxy resin, and an inorganic insulating material such as silicon oxide, silicon oxynitride, silicon nitride oxide, silicon nitride, or aluminum oxide can be given.

[Display Device 100B]

FIG. 9A shows a cross section of a display device 100B.

The display device 100B is different from the display device 100A mainly in that the lens 149 and the protective layer 195 are included.

Providing the protective layer 195 covering the light-receiving element 110 and the light-emitting element 190 can inhibit entry of impurities such as water into the light-receiving element 110 and the light-emitting element 190, so that the reliability of the light-receiving element 110 and the light-emitting element 190 can be increased.

In the region 228 in the vicinity of an end portion of the display device 100B, the insulating layer 215 and the protective layer 195 are preferably in contact with each other through an opening in the insulating layer 214. In particular, the inorganic insulating film included in the insulating layer 215 and the inorganic insulating film included in the protective layer 195 are preferably in contact with each other. Thus, entry of impurities from the outside into the display portion 162 through the organic insulating film can be inhibited. Consequently, the display device 100B can have higher reliability.

FIG. 9B illustrates an example in which the protective layer 195 has a three-layer structure. In FIG. 9B, the protective layer 195 includes an inorganic insulating layer 195a over the common electrode 115, an organic insulating layer 195b over the inorganic insulating layer 195a, and an inorganic insulating layer 195c over the organic insulating layer 195b.

An end portion of the inorganic insulating layer 195a and an end portion of the inorganic insulating layer 195c extend beyond an end portion of the organic insulating layer 195b and are in contact with each other. The inorganic insulating layer 195a is in contact with the insulating layer 215 (inorganic insulating layer) through the opening in the insulating layer 214 (organic insulating layer). Accordingly, the light-receiving element 110 and the light-emitting element 190 can be surrounded by the insulating layer 215 and the protective layer 195, whereby the reliability of the light-receiving element 110 and the light-emitting element 190 can be increased.

As described above, the protective layer 195 may have a stacked-layer structure of an organic insulating film and an inorganic insulating film. In that case, an end portion of the inorganic insulating layer preferably extends beyond an end portion of the organic insulating layer.

The lens 149 is provided on the surface of the substrate 152, which faces the substrate 151. The lens 149 has the convex surface on the substrate 151 side. It is preferable that the light-receiving region of the light-receiving element 110 overlap with the lens 149 and do not overlap with the light-emitting layer 193. Thus, the sensitivity and accuracy of a sensor using the light-receiving element 110 can be increased.

The lens 149 preferably has a refractive index greater than or equal to 1.3 and less than or equal to 2.5. The lens 149 can be formed using at least one of an inorganic material and an organic material. For example, a material containing a resin can be used for the lens 149. Moreover, a material containing at least one of an oxide and a sulfide can be used for the lens 149.

Specifically, a resin containing chlorine, bromine, or iodine, a resin containing a heavy metal atom, a resin having an aromatic ring, a resin containing sulfur, and the like can be used for the lens 149. Alternatively, a material containing a resin and nanoparticles of a material having a higher refractive index than the resin can be used for the lens 149. Titanium oxide, zirconium oxide, or the like can be used for the nanoparticles.

In addition, cerium oxide, hafnium oxide, lanthanum oxide, magnesium oxide, niobium oxide, tantalum oxide, titanium oxide, yttrium oxide, zinc oxide, an oxide containing indium and tin, an oxide containing indium, gallium, and zinc, and the like can be used for the lens 149. Alternatively, zinc sulfide and the like can be used for the lens 149.

In the display device 100B, the protective layer 195 and the substrate 152 are bonded to each other with the adhesive layer 142. The adhesive layer 142 is provided to overlap with the light-receiving element 110 and the light-emitting element 190; that is, the display device 100B employs a solid sealing structure.

[Display Device 100C]

FIG. 10A shows a cross section of a display device 100C.

The display device 100C differs from the display device 100B in transistor structures.

The display device 100C includes a transistor 208, a transistor 209, and a transistor 210 over the substrate 151.

Each of the transistors 208, 209, and 210 includes the conductive layer 221 functioning as a gate, the insulating layer 211 functioning as a gate insulating layer, a semiconductor layer including a channel formation region 231i and a pair of low-resistance regions 231n, the conductive layer 222a connected to one of the low-resistance regions 231n, the conductive layer 222b connected to the other low-resistance region 231n, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231i. The insulating layer 225 is positioned between the conductive layer 223 and the channel formation region 231i.

The conductive layer 222a and the conductive layer 222b are each connected to the corresponding low-resistance region 231n through openings provided in the insulating layer 225 and the insulating layer 215. One of the conductive layer 222a and the conductive layer 222b serves as a source, and the other serves as a drain.

The pixel electrode 191 of the light-emitting element 190 is electrically connected to one of the pair of low-resistance regions 231n of the transistor 208 through the conductive layer 222b.

The pixel electrode 111 of the light-receiving element 110 is electrically connected to the other of the pair of low-resistance regions 231n of the transistor 209 through the conductive layer 222b.

FIG. 10A illustrates an example in which the insulating layer 225 covers a top and side surfaces of the semiconductor layer. Meanwhile, in FIG. 10B, the insulating layer 225 overlaps with the channel formation region 231i of the semiconductor layer 231 and does not overlap with the low-resistance regions 231n. The structure illustrated in FIG. 10B is obtained by processing the insulating layer 225 with the conductive layer 223 as a mask, for example. In FIG. 10B, the insulating layer 215 is provided to cover the insulating layer 225 and the conductive layer 223, and the conductive layer 222a and the conductive layer 222b are connected to the low-resistance regions 231n through the openings in the insulating layer 215. Furthermore, an insulating layer 218 covering the transistor may be provided.

The display device 100C is different from the display device 100B in that a colored layer 147 is included.

The colored layer 147 is positioned over the insulating layer 214 and the bank 216 covers the top surface and the side surface of the colored layer 147.

In FIG. 10A, the colored layer 147 and the light-receiving element 110 are provided apart from each other. Similarly, the colored layer 147 and the light-emitting element 190 are provided apart from each other. The position of the colored layer 147 is not limited to the arrangement shown in FIG. 10A. As shown in FIG. 10C, the colored layer 147 may cover one or both of an end portion of the pixel electrode 111 and an end portion of the pixel electrode 191.

In FIG. 10A, the colored layer 147 is provided apart from the light-receiving element 110 and the light-emitting element 190. Thus, the colored layer 147 is less likely to affect the light-receiving element 110 and the light-emitting element 190 even when having low resistivity, which is preferable because the range of choices for materials used for the colored layer 147 is widen.

In FIG. 10C, the colored layer 147 covers the end portion of the pixel electrode 111 and the end portion of the pixel electrode 191; accordingly, the area of the colored layer 147 can be increased. The larger the area where the colored layer 147 is provided is, the more stray light generated in the display device is absorbed by the colored layer 147, which is preferable because the amount of stray light entering the light-receiving element 110 can be reduced. Consequently, noise can be reduced, and the sensitivity of a sensor using the light-receiving element 110 can be increased.

[Display Device 100D]

FIG. 11 shows a cross section of a display device 100D.

The display device 100D is different from the display device 100C in that the colored layer 147 is not included but the colored layer 148a is included.

The colored layer 148a includes a portion in contact with a top surface of the pixel electrode 111 in the light-receiving element 110 and a portion in contact with a side surface of the bank 216.

When the colored layer 148a absorbs stray light generated in the display device 100D, the amount of stray light entering the light-receiving element 110 can be reduced. Consequently, noise can be reduced, and the sensitivity of a sensor using the light-receiving element 110 can be increased.

In addition, the display device 100D differs from the display device 100C in that neither the substrate 151 nor the substrate 152 is included and that the substrate 153, the substrate 154, the adhesive layer 155, and the insulating layer 212 are included.

The substrate 153 and the insulating layer 212 are attached to each other with the adhesive layer 155. The substrate 154 and the protective layer 195 are attached to each other with the adhesive layer 142.

The display device 100D is formed in such a manner that the insulating layer 212, the transistor 208, the transistor 209, the light-receiving element 110, the light-emitting element 190, and the like, which are formed over a formation substrate are transferred onto the substrate 153. The substrate 153 and the substrate 154 are preferably flexible. Accordingly, the flexibility of the display device 100D can be increased.

The inorganic insulating film that can be used as the insulating layer 211, the insulating layer 213, and the insulating layer 215 can be used as the insulating layer 212.

The display device 100C shows an example in which the lens 149 is not provided, and the display device 100D shows an example in which the lens 149 is provided. The lens 149 can be provided as appropriate in accordance with usage of a sensor or the like.

[Metal Oxide]

A metal oxide that can be used for the semiconductor layer will be described below.

Note that in this specification and the like, a metal oxide containing nitrogen is also collectively referred to as a metal oxide in some cases. A metal oxide containing nitrogen may be referred to as a metal oxynitride. For example, a metal oxide containing nitrogen, such as zinc oxynitride (ZnON), may be used for the semiconductor layer.

Note that in this specification and the like, "c-axis aligned crystal (CAAC)" or "cloud-aligned composite (CAC)" might be stated. Note that CAAC refers to an example of a crystal structure, and CAC refers to an example of a function or a material composition.

For example, a CAC (Cloud-Aligned Composite)-OS (Oxide Semiconductor) can be used for the semiconductor layer.

A CAC-OS or a CAC-metal oxide has a conducting function in part of the material and has an insulating function in another part of the material; as a whole, the CAC-OS or the CAC-metal oxide has a function of a semiconductor. In the case where the CAC-OS or the CAC-metal oxide is used in a semiconductor layer of a transistor, the conducting function is to allow electrons (or holes) serving as carriers to flow, and the insulating function is to not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

Furthermore, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, in some cases, the conductive regions are observed to be coupled in a cloud-like manner with their boundaries blurred.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide includes components having different bandgaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, high current driving capability in an on state of the transistor, that is, a high on-state current and high field-effect mobility can be obtained.

In other words, the CAC-OS or the CAC-metal oxide can also be referred to as a matrix composite or a metal matrix composite.

Oxide semiconductors (metal oxides) are classified into a single crystal oxide semiconductor and a non-single crystal oxide semiconductor. Examples of a non-single-crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is found to be inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. On the other hand, a clear crystal grain boundary cannot be observed in the CAAC-OS; thus, it can be said that a reduction in electron mobility due to the crystal grain boundary is less likely to occur. Entry of impurities, formation of defects, or the like might decrease the crystallinity of a metal oxide; thus, it can be said that the CAAC-OS is a metal oxide that has small amounts of impurities and defects (e.g., oxygen vacancies (also referred to as Vo)). Thus, a metal oxide including a CAAC-OS is physically stable. Therefore, the metal oxide including a CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

Note that indium-gallium-zinc oxide (hereinafter referred to as IGZO) that is a kind of metal oxide containing indium, gallium, and zinc has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor. The a-like OS includes a void or a low-density region. That is, the a-like OS has low crystallinity as compared with the nc-OS and the CAAC-OS.

An oxide semiconductor (metal oxide) can have various structures that show different properties. Two or more of the amorphous oxide semiconductor, the polycrystalline oxide semiconductor, the a-like OS, the nc-OS, and the CAAC-OS may be included in an oxide semiconductor of one embodiment of the present invention.

A metal oxide film that functions as a semiconductor layer can be formed using either or both of an inert gas and an oxygen gas. Note that there is no particular limitation on the flow rate ratio of oxygen (the partial pressure of oxygen) at the time of forming the metal oxide film. However, to obtain a transistor having high field-effect mobility, the flow rate ratio of oxygen (the partial pressure of oxygen) at the time of forming the metal oxide film is preferably higher than or equal to 0% and lower than or equal to 30%, further preferably higher than or equal to 5% and lower than or equal to 30%, still further preferably higher than or equal to 7% and lower than or equal to 15%.

The energy gap of the metal oxide is preferably 2 eV or more, further preferably 2.5 eV or more, still further preferably 3 eV or more. With use of a metal oxide having such a wide energy gap, the off-state current of the transistor can be reduced.

The substrate temperature during the formation of the metal oxide film is preferably lower than or equal to 350° C., further preferably higher than or equal to room temperature and lower than or equal to 200° C., still further preferably higher than or equal to room temperature and lower than or equal to 130° C. The substrate temperature during the deposition of the metal oxide film is preferably room temperature because productivity can be increased.

The metal oxide film can be formed by a sputtering method. Alternatively, a PLD method, a PECVD method, a thermal CVD method, an ALD method, or a vacuum evaporation method, for example, may be used.

As described above, the display device of this embodiment includes a light-receiving element and a light-emitting element in a display portion, and the display portion has both a function of displaying an image and a function of sensing light. Thus, the size and weight of an electronic device can be reduced as compared to the case where a sensor is provided outside a display portion or outside a display device. Moreover, an electronic device having more functions can be obtained by a combination of the display device of this embodiment and a sensor provided outside the display portion or outside the display device.

In the light-receiving element, at least one of layers other than the active layer can be common to a layer in the light-emitting element (EL element). In the light-receiving element, all of the layers other than the active layer can be common to the layers in the light-emitting element (EL element). For example, with only the addition of the step of forming the active layer to the manufacturing process of the light-emitting element, the light-emitting element and the light-receiving element can be formed over one substrate. In the light-receiving element and the light-emitting element, their pixel electrodes can be formed using the same material in the same step, and their common electrodes can be formed using the same material in the same step. When a circuit electrically connected to the light-receiving element and a circuit electrically connected to the light-emitting element are formed using the same material in the same process, the manufacturing process of the display device can be simplified. In such a manner, a display device that incorporates a light-receiving element and is highly convenient can be manufactured without complicated steps.

The display device of this embodiment includes a colored layer between a light-receiving element and a light-emitting element. The colored layer may serve as a bank which electrically isolates the light-receiving element from the light-emitting element. Since the colored layer can absorb stray light in the display device, the sensitivity of a sensor using a light-receiving element can be increased.

This embodiment can be combined with the other embodiments as appropriate. In this specification, in the case where a plurality of structure examples are shown in one embodiment, the structure examples can be combined as appropriate.

Embodiment 2

In this embodiment, a display device of one embodiment of the present invention will be described with reference to FIG. 12.

A display device of one embodiment of the present invention includes first pixel circuits including a light-receiving element and second pixel circuits including a light-emitting element. The first pixel circuits and the second pixel circuits are arranged in a matrix.

Figure 12A:
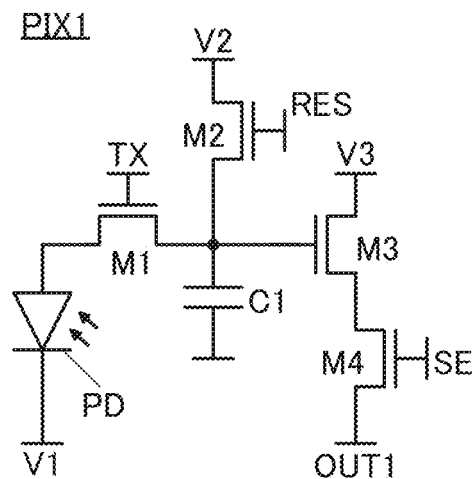
FIG. 12A and FIG. 12B are each a circuit diagram illustrating an example of a pixel circuit.
Figure 12B:
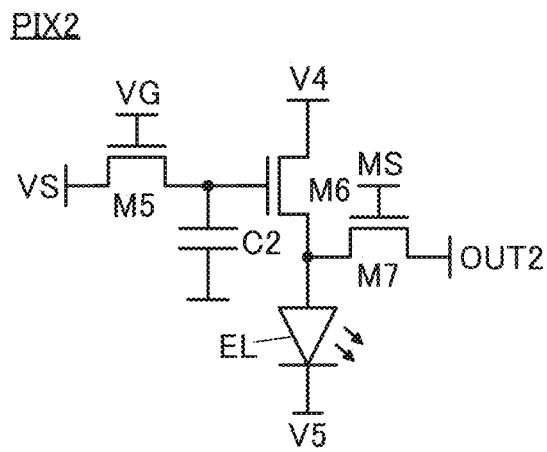

FIG. 12A illustrates an example of the first pixel circuit including a light-receiving element. FIG. 12B illustrates an example of the second pixel circuit including a light-emitting element.

A pixel circuit PIX1 illustrated in FIG. 12A includes a light-receiving element PD, a transistor M1, a transistor M2, a transistor M3, a transistor M4, and a capacitor C1. Here, an example of the case where a photodiode is used as the light-receiving element PD is illustrated.

A cathode of the light-receiving element PD is electrically connected to a wiring V1, and an anode is electrically connected to one of a source and a drain of the transistor M1. A gate of the transistor M1 is electrically connected to a wiring TX, and the other of the source and the drain is electrically connected to one electrode of the capacitor C1, one of a source and a drain of the transistor M2, and a gate of the transistor M3. A gate of the transistor M2 is electrically connected to a wiring RES, and the other of the source and the drain is electrically connected to a wiring V2. One of a source and a drain of the transistor M3 is electrically connected to a wiring V3, and the other of the source and the drain is electrically connected to one of a source and a drain of the transistor M4. A gate of the transistor M4 is electrically connected to a wiring SE, and the other of the source and the drain is electrically connected to a wiring OUT1.

A constant potential can be supplied to the wiring V1, the wiring V2, and the wiring V3. When the light-receiving element PD is driven with a reverse bias, the wiring V2 can be supplied with a potential lower than the potential of the wiring V1. The transistor M2 is controlled by a signal supplied to the wiring RES and has a function of resetting the potential of a node connected to the gate of the transistor M3 to a potential supplied to the wiring V2. The transistor M1 is controlled by a signal supplied to the wiring TX and has a function of controlling the timing at which the potential of the node changes, in accordance with a current flowing through the light-receiving element PD. The transistor M3 functions as an amplifier transistor for performing output in response to the potential of the node. The transistor M4 is controlled by a signal supplied to the wiring SE and functions as a selection transistor for reading an output corresponding to the potential of the node by an external circuit connected to the wiring OUT1.

A pixel circuit PIX2 illustrated in FIG. 12B includes a light-emitting element EL, a transistor M5, a transistor M6, a transistor M7, and a capacitor C2. Here, an example in which a light-emitting diode is used as the light-emitting element EL is illustrated. In particular, an organic EL element is preferably used as the light-emitting element EL.

A gate of the transistor M5 is electrically connected to a wiring VG, one of a source and a drain is electrically connected to a wiring VS, and the other of the source and the drain is electrically connected to one electrode of the capacitor C2 and a gate of the transistor M6. One of a source and a drain of the transistor M6 is electrically connected to a wiring V4, and the other of the source and the drain is electrically connected to an anode of the light-emitting element EL and one of a source and a drain of the transistor M7. A gate of the transistor M7 is electrically connected to a wiring MS, and the other of the source and the drain is electrically connected to a wiring OUT2. A cathode of the light-emitting element EL is electrically connected to a wiring V5.

A constant potential is supplied to the wiring V4 and the wiring V5. In the light-emitting element EL, the anode side can have a high potential and the cathode side can have a lower potential than the anode side. The transistor M5 is controlled by a signal supplied to the wiring VG and functions as a selection transistor for controlling a selection state of the pixel circuit PIX2. The transistor M6 functions as a driving transistor that controls a current flowing through the light-emitting element EL in accordance with a potential supplied to the gate. When the transistor M5 is in an on state, a potential supplied to the wiring VS is supplied to the gate of the transistor M6, and the emission luminance of the light-emitting element EL can be controlled in accordance with the potential. The transistor M7 is controlled by a signal supplied to the wiring MS and has a function of outputting a potential between the transistor M6 and the light-emitting element EL to the outside through the wiring OUT2.

The wiring V1, to which the cathode of the light-receiving element PD is electrically connected, and the wiring V5, to which the cathode of the light-emitting element EL is electrically connected, can be provided in the same layer and have the same level of potential.

Note that in the display device of this embodiment, the light-emitting element may be made to emit light in a pulsed manner so as to display an image. A reduction in the driving time of the light-emitting element can reduce power consumption of the display device and suppress heat generation of the display device. An organic EL element is particularly preferable because of its favorable frequency characteristics. The frequency can be higher than or equal to 1 kHz and lower than or equal to 100 MHz, for example.

Here, a transistor in which a metal oxide (an oxide semiconductor) is used in a semiconductor layer where a channel is formed is preferably used as the transistor M1, the transistor M2, the transistor M3, and the transistor M4 included in the pixel circuit PIX1 and the transistor M5, the transistor M6, and the transistor M7 included in the pixel circuit PIX2.

A transistor using a metal oxide having a wider band gap and a lower carrier density than silicon can achieve an extremely low off-state current. Thus, such a low off-state current enables retention of charges accumulated in a capacitor that is connected in series with the transistor for a long time. Therefore, it is particularly preferable to use a transistor using an oxide semiconductor as the transistor M1, the transistor M2, and the transistor M5 each of which is connected in series with the capacitor C1 or the capacitor C2. Moreover, the use of transistors using an oxide semiconductor as the other transistors can reduce the manufacturing cost.

Alternatively, transistors using silicon as a semiconductor in which a channel is formed can be used as the transistor M1 to the transistor M7. In particular, the use of silicon with high crystallinity, such as single crystal silicon or polycrystalline silicon, is preferable because high field-effect mobility is achieved and higher-speed operation is possible.

Alternatively, a transistor using an oxide semiconductor may be used as one or more of the transistor M1 to the transistor M7, and transistors using silicon may be used as the other transistors.

Although n-channel transistors are shown as the transistors in FIG. 12A and FIG. 12B, p-channel transistors can be used as appropriate.

The transistors included in the pixel circuit PIX1 and the transistors included in the pixel circuit PIX2 are preferably formed side by side over the same substrate. It is particularly preferable that the transistors included in the pixel circuits PIX1 and the transistors included in the pixel circuits PIX2 be periodically arranged in one region.

One or more layers including the transistor and/or the capacitor are preferably provided to overlap with the light-receiving element PD or the light-emitting element EL. Thus, the effective area of each pixel circuit can be reduced, and a high-resolution light-receiving portion or display portion can be achieved.

This embodiment can be combined with the other embodiments as appropriate.

Embodiment 3

In this embodiment, electronic devices of one embodiment of the present invention will be described with reference to FIG. 13 to FIG. 15.

An electronic device in this embodiment is provided with the display device of one embodiment of the present invention. For example, the display device of one embodiment of the present invention can be used in a display portion of the electronic device. The display device of one embodiment of the present invention has a function of sensing light, and thus can perform biological authentication with the display portion or detect a touch or a near touch on the display portion. Thus, the electronic device can have improved functionality and convenience, for example.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 13A:
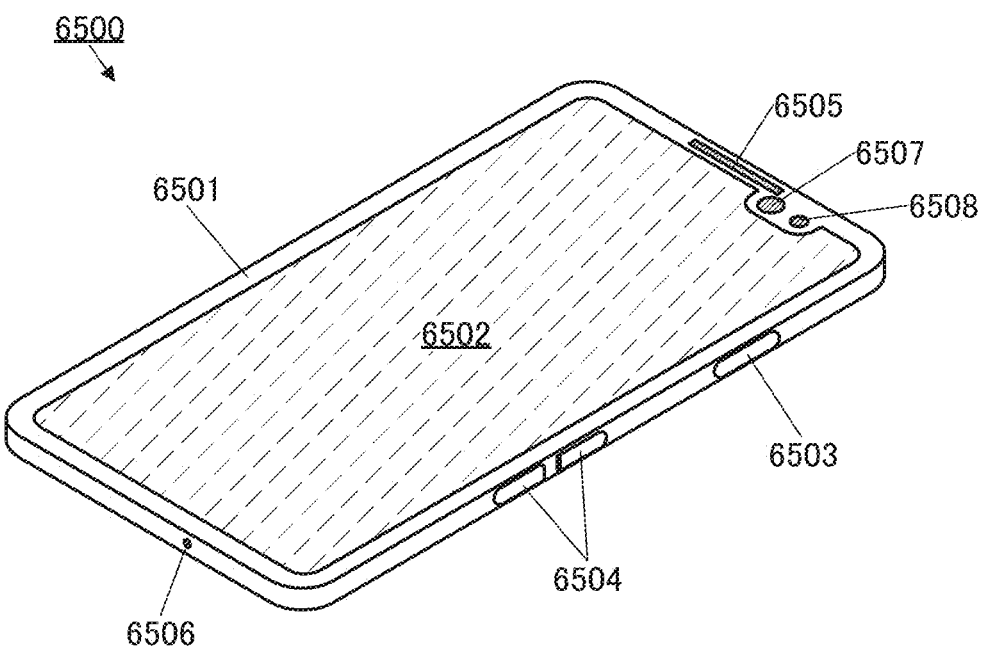
FIG. 13A and FIG. 13B are diagrams illustrating an example of an electronic device.

An electronic device 6500 illustrated in FIG. 13A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

Figure 13B:
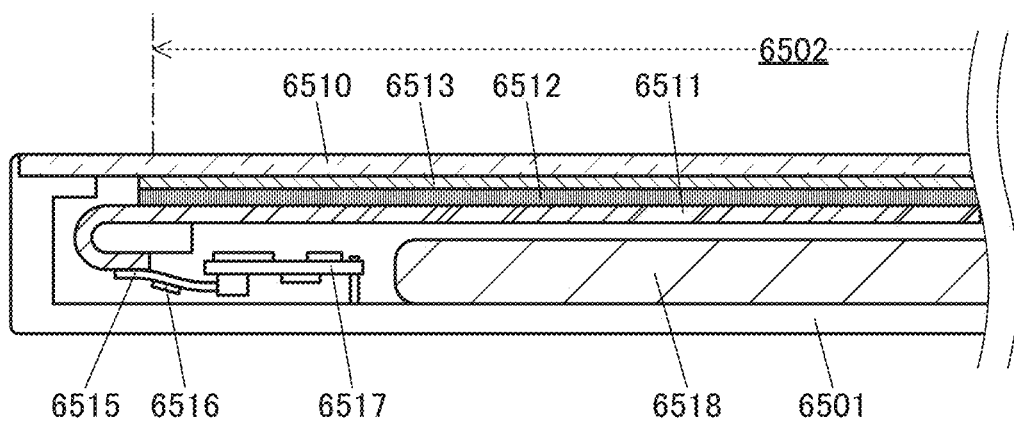

FIG. 13B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not shown).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be provided. Since the display panel 6511 is extremely thin, the battery 6518 with high capacity can be mounted with the thickness of the electronic device controlled. An electronic device with a narrow frame can be obtained when part of the display panel 6511 is folded back so that the portion connected to the FPC 6515 is positioned on the rear side of a pixel portion.

Figure 14A:
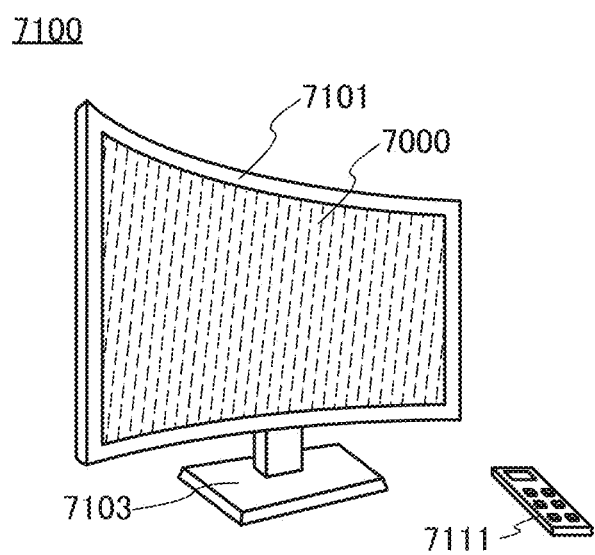
FIG. 14A, FIG. 14B, FIG. 14C, and FIG. 14D are diagrams each illustrating an example of an electronic device.

FIG. 14A illustrates an example of a television device. In a television device 7100, a display portion 7000 is incorporated in a housing 7101. Here, a structure in which the housing 7101 is supported by a stand 7103 is illustrated.

The display device of one embodiment of the present invention can be used in the display portion 7000.

Operation of the television device 7100 illustrated in FIG. 14A can be performed with an operation switch provided in the housing 7101 or a separate remote controller 7111. Alternatively, the display portion 7000 may include a touch sensor, and the television device 7100 may be operated by touch on the display portion 7000 with a finger or the like. The remote controller 7111 may be provided with a display portion for displaying data output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 14B:
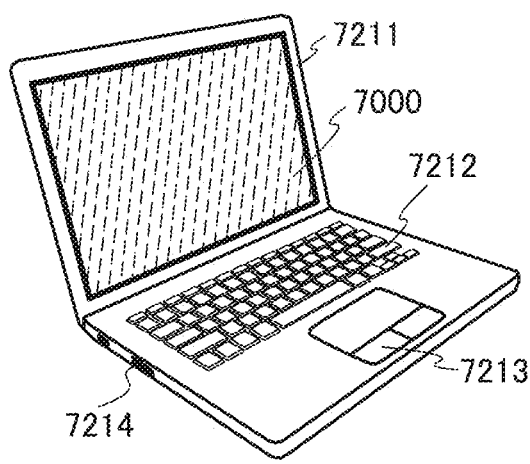

FIG. 14B illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The display device of one embodiment of the present invention can be used in the display portion 7000.

Figure 14C:
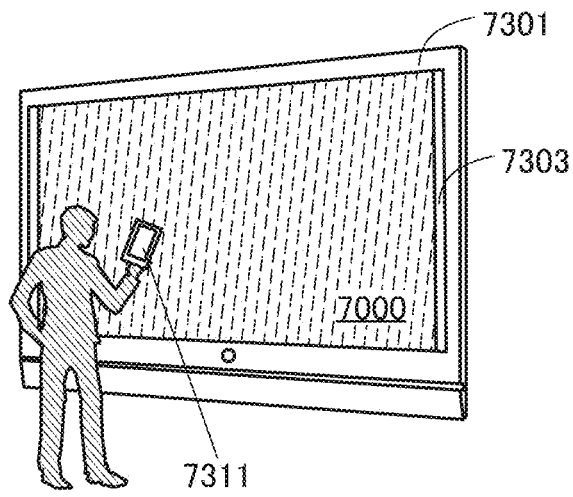
Figure 14D:
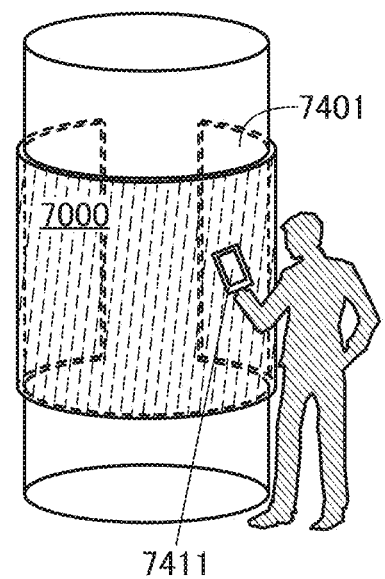

FIGS. 14C and 14D illustrate examples of digital signage.

Digital signage 7300 illustrated in FIG. 14C includes a housing 7301, the display portion 7000, a speaker 7303, and the like. Furthermore, the digital signage can include an LED lamp, operation keys (including a power switch or an operation switch), a connection terminal, a variety of sensors, a microphone, and the like.

FIG. 14D is digital signage 7400 attached to a cylindrical pillar 7401. The digital signage 7400 includes the display portion 7000 provided along a curved surface of the pillar 7401.

The display device of one embodiment of the present invention can be used for the display portion 7000 in FIGS. 14C and 14D.

A larger area of the display portion 7000 can increase the amount of data that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 14C and FIG. 14D, it is preferable that the digital signage 7300 or the digital signage 7400 can work with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Electronic devices shown in FIG. 15A to FIG. 15F include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices shown in FIG. 15A to FIG. 15F have a variety of functions. For example, the electronic devices can have a function of displaying a variety of data (a still image, a moving image, a text image, and the like) on the display portion, a touch panel function, a function of displaying a calendar, date, time, and the like, a function of controlling processing with use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each include a camera or the like and have a function of taking a still image or a moving image and storing the taken image in a recording medium (an external recording medium or a recording medium incorporated in the camera), a function of displaying the taken image on the display portion, or the like.

The details of the electronic devices illustrated in FIG. 15A to FIG. 15F are described below.

Figure 15A:
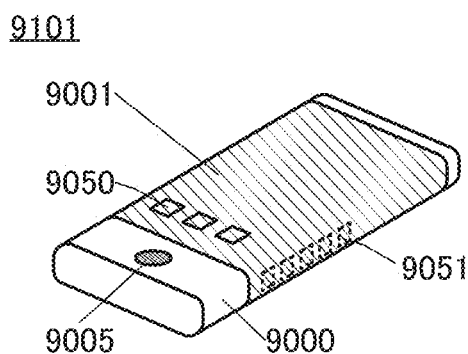
FIG. 15A, FIG. 15B, FIG. 15C, FIG. 15D, FIG. 15E, and FIG. 15F are diagrams illustrating examples of electronic devices.

FIG. 15A is a perspective view showing a portable information terminal 9101. For example, the portable information terminal 9101 can be used as a smartphone. Note that the portable information terminal 9101 may be provided with the speaker 9003, the connection terminal 9006, the sensor 9007, or the like. The portable information terminal 9101 can display characters and image information on its plurality of surfaces. FIG. 15A shows an example where three icons 9050 are displayed. Information 9051 indicated by dashed rectangles can be displayed on another surface of the display portion 9001. Examples of the information 9051 include notification of reception of an e-mail, SNS, or an incoming call, the title and sender of an e-mail, SNS, or the like, the date, the time, remaining battery, and the reception strength of an antenna. Alternatively, the icon 9050 or the like may be displayed in the position where the information 9051 is displayed.

Figure 15B:
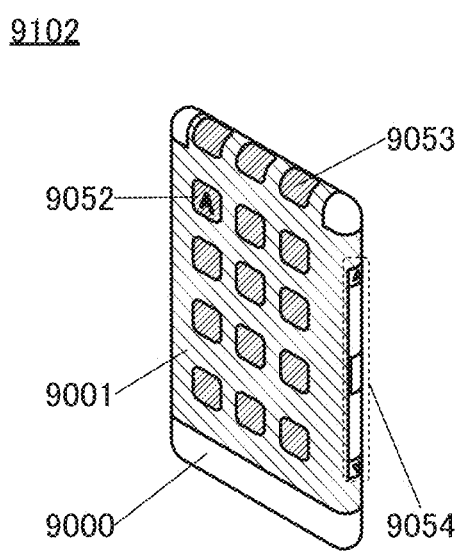

FIG. 15B is a perspective view showing a portable information terminal 9102. The portable information terminal 9102 has a function of displaying information on three or more surfaces of the display portion 9001. Here, an example in which information 9052, information 9053, and information 9054 are displayed on different surfaces is shown. For example, a user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer the call, for example.

Figure 15C:
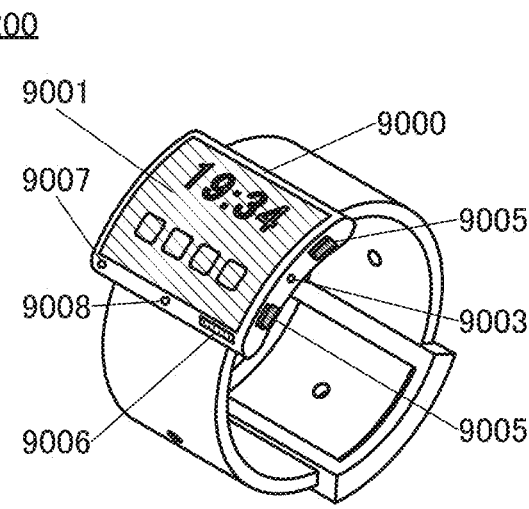

FIG. 15C is a perspective view showing a watch-type portable information terminal 9200. For example, the portable information terminal 9200 can be used as a smart watch. The display surface of the display portion 9001 is curved and provided, and display can be performed along the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 15D:
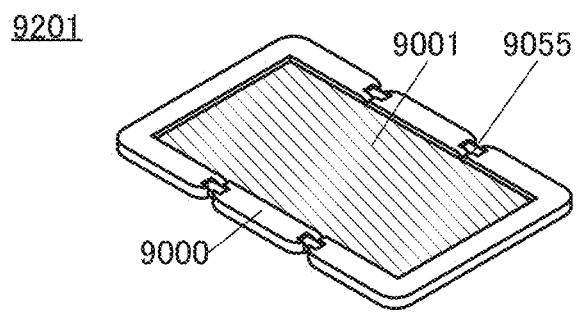
Figure 15E:
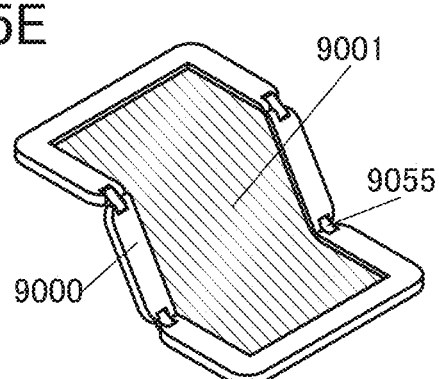
Figure 15F:
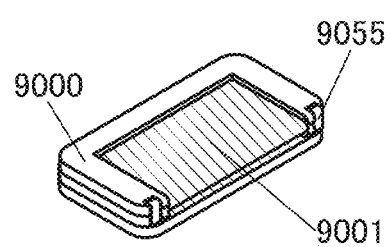

FIG. 15D, FIG. 15E, and (F) are perspective views showing a foldable portable information terminal 9201. FIG. 15D is a perspective view of an opened state of the portable information terminal 9201, FIG. 15F is a perspective view of a folded state thereof, and FIG. 15E is a perspective view of a state in the middle of change from one of FIG. 15D and FIG. 15F to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be folded with a radius of curvature greater than or equal to 0.1 mm and less than or equal to 150 mm.

This embodiment can be combined with the other embodiments and the examples as appropriate.

Example 1

In this example, calculation results of an imaging range of one pixel included in the display device of one embodiment of the present invention will be described with reference to FIG. 16 to FIG. 18.

Component factors used in the calculation of this example and positional relations of the component factors are described with reference to FIG. 16A and FIG. 16B.

Figure 16A:
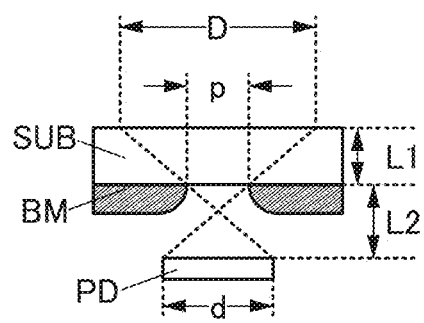
FIG. 16A and FIG. 16B are each a cross-sectional view illustrating a positional relation of factors used for calculation in Example 1.
Figure 16B:
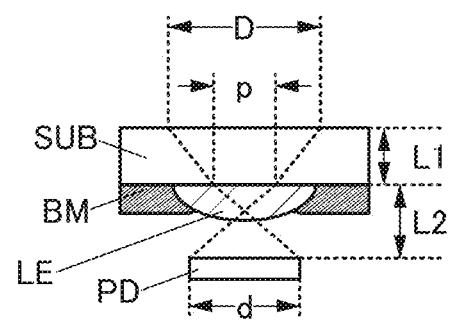

As illustrated in FIG. 16A and FIG. 16B, a light-blocking layer BM is provided on a substrate SUB. A light-receiving element PD is provided apart from the substrate SUB and the light-blocking layer BM. The light-blocking layer BM has an opening, and the light-receiving element PD overlaps with the opening.

A structure illustrated in FIG. 16B is different from that in FIG. 16A in that the substrate SUB is provided with a lens LE. The lens LE overlaps with the opening of the light-blocking layer BM and the light-receiving element PD.

In this example, supposing that the light-receiving element PD was used as a fingerprint sensor or the like, an object was assumed to be in contact with a surface of the substrate SUB.

In this example, the calculation was carried on using the following shown in FIG. 16A and FIG. 16B: a size d of the light-receiving element PD; an imaging range D of the light-receiving element PD; a distance L1 between a pinhole and the object; and a distance L2 between the light-receiving element PD and the pinhole; and a diameter p of the pinhole.

Note that the distance L1 corresponds to an optical path length of the substrate SUB. The distance L1 in FIG. 16B can be referred to as a distance between the lens LE and the object. The diameter p of the pinhole corresponds to a diameter of the opening of the light-blocking layer BM.

First, the relation between the diameter p of the pinhole and the imaging range D of the light-receiving element PD was calculated with the structure illustrated in FIG. 16A.

Conditions used in the calculation was determined on the assumption that the light-receiving element is incorporated in a flexible OLED panel with a side by side mode where light-emitting layers are separated by colors.

Specifically, the resolution was 254 ppi, the pixel size was 100 μm square, and the size d of the light-receiving element PD was 14 μm square, and the distance L2 was 30 μm. One pixel was assumed to have a red (R) sub-pixel, a green (G) sub-pixel, a blue (B) sub-pixel, and a sub-pixel including the light-receiving element PD. The total aperture ratio of the RGB sub-pixels was 10.1%, the aperture ratio of the sub-pixel including the light-receiving element PD was 2.0%, and the aperture ratio of one pixel was 12.1%.

Figure 17:
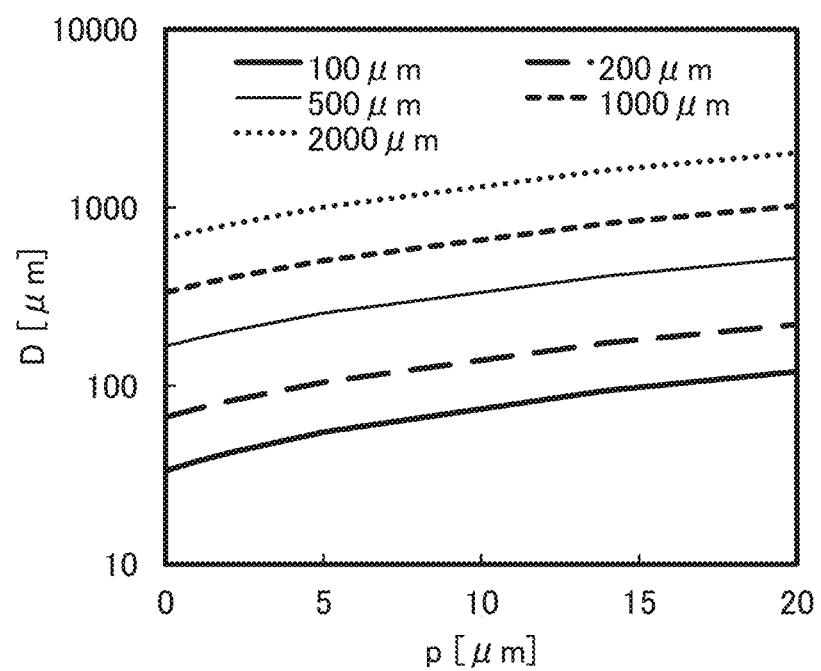
FIG. 17 is a graph showing calculation results in Example 1.

FIG. 17 shows the calculated relation between the diameter p of the pinhole and the imaging range D of the light-receiving element PD. The results shown in FIG. 17 are based on five conditions with different values of the distance L1 (the distance L1=100 μm, 200 μm, 500 μm, 1000 μm, and 2000 μm).

The calculation was performed under the condition where the pixel size was 100 μm square as described above, which suggests that the imaging range of one light-receiving element PD falls within a region of one pixel when the imaging range D of the light-receiving element PD is less than or equal to 100 μm. Meanwhile, when the imaging range D of the light-receiving element PD exceeds 100 μm, the imaging range is superimposed on an imaging range D of an adjacent light-receiving element PD; accordingly, a captured image is blurred.

It was found from FIG. 17 that under the conditions of the distance L1 were 100 μm and 200 μm, whether the imaging range D of the light-receiving element PD can fall within a region of one pixel depends on the condition of the diameter p of the pinhole. It was also found that under the condition of the distance L1 of 500 μm or more, the imaging range D of the light-receiving element PD becomes larger than a region of one pixel even with a condition of the diameter p≈0 μm.

Note that even with a condition or structure where imaging ranges D of adjacent light-receiving elements PD are superimposed, a clearer image can be obtained by performing image processing for reducing an image blur after capturing the image. Meanwhile, it is preferable that the imaging region D of the light-receiving element PD fall within a region of one pixel because the image processing is not necessary.

Since the distance L1 corresponds to the optical path length of the substrate SUB as described above, it is necessary to make the substrate SUB thin to shorten the distance L1. Thus, there is a risk of lowering the strength and the resistance to bending of the flexible OLED panel.

In view of the above, calculation was conducted to evaluate whether use of the lens LE can increase the distance L1 enabling the imaging range D of the light-receiving element PD to fall within a region of one pixel.

Specifically, the relation between the imaging range D of the light-receiving element PD and the distance L1 between the pinhole and the object was calculated with the structure illustrated in FIG. 16B.

The conditions used in the calculation were the same as those described above. The diameter p of the pinhole was 14 μm.

Figure 18:
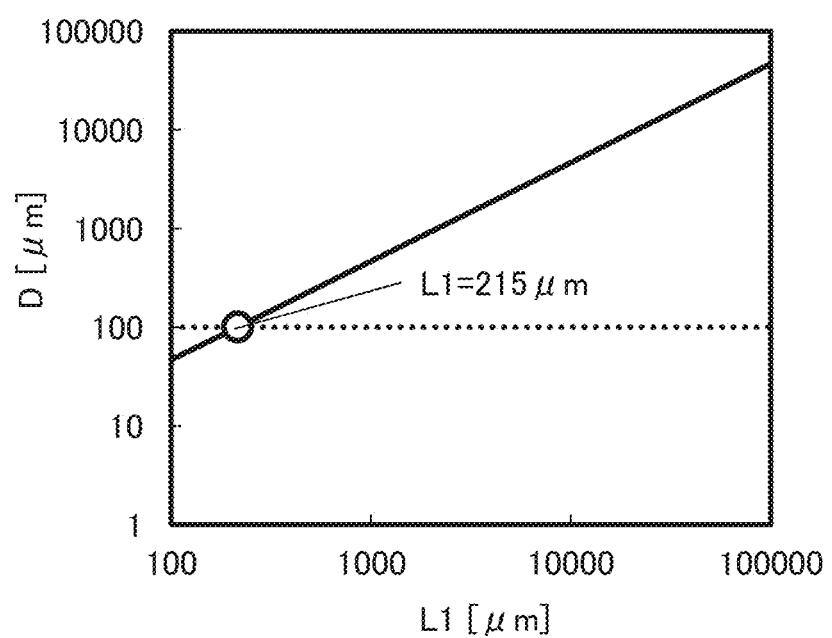
FIG. 18 is a graph showing calculation results in Example 1.

FIG. 18 shows the calculated relation between the imaging range D of the light-receiving element PD and the distance L1 between the pinhole and the object.

It can be found from FIG. 18 that when the distance L1 is less than or equal to 215 μm, the imaging range D of the light-receiving element PD is less than or equal to 100 μm and can fall within a region of one pixel.

In contrast, according to FIG. 17 showing the case where the lens LE is not used, the imaging range D can fall within a region of one pixel under the conditions where the diameter p=14 μm and the distance L1=100 μm, whereas the imaging range D of the light-receiving element PD is wider than 100 μm under the conditions where the diameter p=14 μm and the distance L1=200 μm.

In other words, according to the results shown in FIG. 17 and FIG. 18, use of the lens LE can increase the range of the distance L1 enabling the imaging range D of the light-receiving element PD to fall within a region of one pixel. Specifically, under the condition of the same diameter p of the pinhole, use of the lens LE enables the imaging range D to fall within a region of one pixel even when the distance L1 is made long, as compared to the case of not using the lens LE.

As the distance L1 can be longer, the thickness of the substrate SUB can be increased. For example, the substrate itself can be made thick, and in addition, at least one of an antistatic film, a water repellent film, a hard coat film, a shock absorbing layer, and the like can be provided for the substrate. Thus, the strength, the resistance to bending, and the reliability of the flexible OLED panel can be increased.

As described above, from the results of this example, the existence of the condition which enables the imaging range D of the light-receiving element PD to fall within a region of one pixel, regardless of whether the lens LE is provided or not, was able to be confirmed. In addition, it was found that the condition can be expanded by providing the lens LE. For example, the thickness of the substrate SUB can be increased, which indicates that the strength, the resistance to bending, the reliability of the flexible OLED panel can be increased.

Example 2

In this example, a light-receiving element was fabricated and used for an image sensor to perform imaging. Results thereof will be described.

A structure of a light-receiving element 1 in this example is in common with that of a light-emitting element, which is a stacked structure that can be fabricated by replacing a light-emitting layer of the light-emitting element with an active layer of the light-receiving element. A comparative light-receiving element 2 whose structure is nothing in common with that of the light-emitting element has a stacked structure suitable for an image sensor.

Chemical formulae of materials used in this example are shown below.

[Chemical Formula 1]

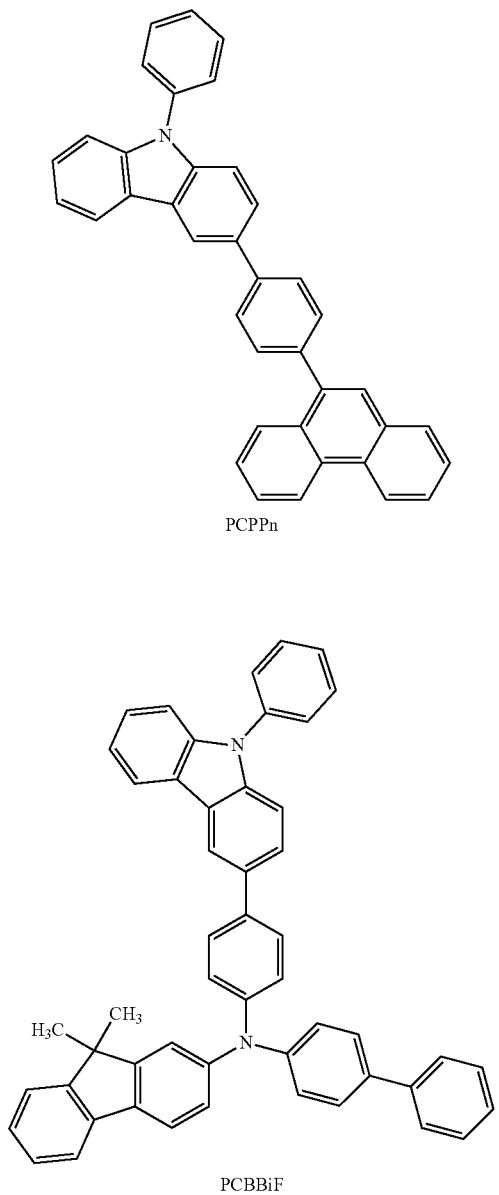

PCPPn

PCBBiF

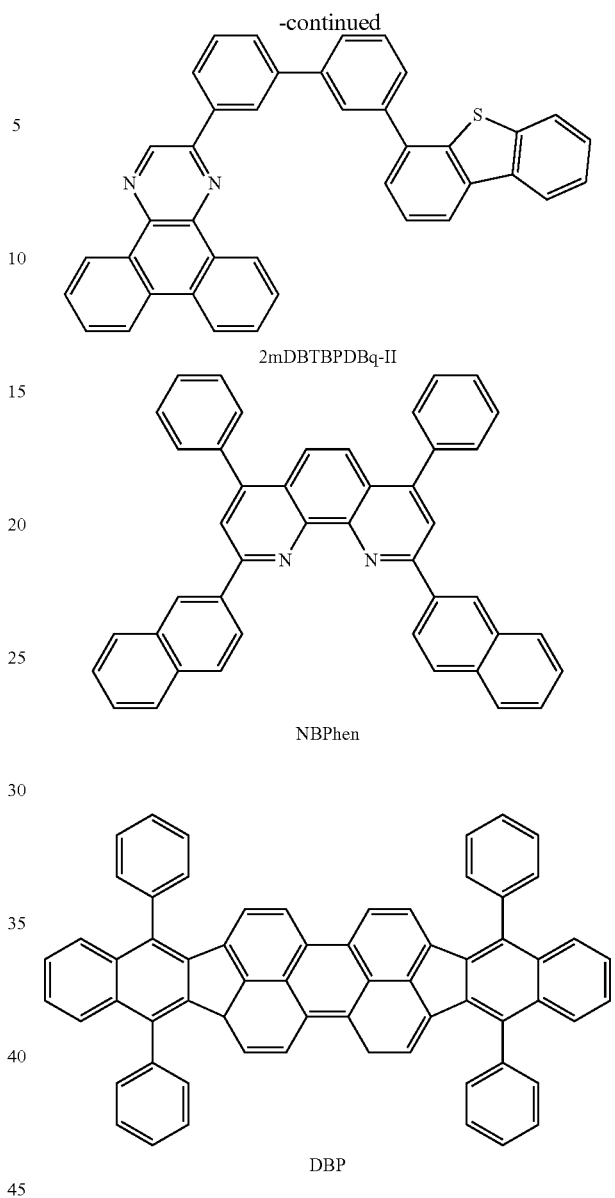

2mDBTBPDBq-II

NBPhen

DBP

Table 1 shows an element structure of the light-receiving element of this example. On the basis of Table 1, the light-receiving element 1 and the comparative light-receiving element 2 are described.

TABLE 1

| | First electrode | First buffer layer | Active layer | Second buffer layer | | | Second electrode | |
|---|---|---|---|---|---|---|---|---|
| Light-receiving element 1 | Ti\Al\Ti 50\200\ 5 nm | PCPPn:MoOx (=2:1) 15 nm | PCBBiF 60 nm | $C_{70}$:DBP = 9:1 60 nm | 2mDBT BPDBq-II 10 nm | NBPhen 10 nm | LiF 1 nm | Ag:Mg (=10:1) 9 nm | ITO 70 nm |
| Comparative light-receiving element 2 | | $C_{70}$ 10 nm | | | MoOx 60 nm | | | | ITO 70 nm |

[Light-Receiving Element 1]

As shown in Table 1, a first electrode of the light-receiving element 1 has a three-layer structure including a titanium film with a thickness of approximately 50 nm, an aluminum film with a thickness of approximately 200 nm, and a titanium film with a thickness of approximately 5 nm.

A first buffer layer of the light-receiving element 1 corresponds to a hole-injection layer and a hole-transport layer of the light-emitting element.

First, a layer corresponding to a hole-injection layer was formed by co-evaporating 3-[4-(9-phenanthryl)-phenyl]-9-phenyl-9H-carbazole (abbreviation: PCPPn) and molybdenum oxide with a weight ratio of PCPPn:molybdenum oxide=2:1. The layer corresponding to a hole-injection layer was formed to have a thickness of approximately 15 nm.

Next, a layer corresponding to a hole-transport layer was formed to have a thickness of 60 nm by evaporating N-(1,1'-biphenyl-4-yl)-N-[4-(9-phenyl-9H-carbazol-3-yl)phenyl]-9,9-dimethyl-9H-fluoren-2-amine (abbreviation: PCBBiF).

An active layer of the light-receiving element 1 was formed by co-evaporating fullerene ($C_{70}$) and tetraphenyldibenzoperiflanthene (abbreviation: DBP) with a weight ratio of $C_{70}$:DBP=9:1. The active layer was formed to have a thickness of approximately 60 nm.

A second buffer layer of the light-receiving element 1 corresponds to an electron-transport layer and an electron-injection layer of the light-emitting element.

First a layer corresponding to an electron-transport layer was formed in the following manner: 2-[3'-(dibenzothiophen-4-yl)biphenyl-3-yl]dibenzo[f,h]quinoxaline (abbreviation: 2mDBTBPDBq-II) and 2,9-bis(naphthalen-2-yl)-4,7-diphenyl-1,10-phenanthroline (abbreviation: NBPhen) were sequentially deposited by evaporation to have thicknesses of 10 nm and 10 nm, respectively.

Next, a layer corresponding to an electron-injection layer was formed to have a thickness of 1 nm by evaporating lithium fluoride (LiF).

A second electrode of the light-receiving element 1 was formed in the following manner: silver (Ag) and magnesium (Mg) was co-evaporated with a volume ratio of 10:1 to have a thickness of 9 nm; and then indium tin oxide (ITO) was deposited by a sputtering method to have a thickness of 70 nm.

Through the above steps, the light-receiving element 1 was fabricated.

[Comparative Light-Receiving Element 2]

As shown in Table 1, a first electrode of the comparative light-receiving element 2 has a three-layer structure including a titanium film with a thickness of approximately 50 nm, an aluminum film with a thickness of approximately 200 nm, and a titanium film with a thickness of approximately 5 nm.

A first buffer layer of the comparative light-receiving element 2 was formed to have a thickness of approximately 10 nm by evaporating fullerene ($C_{70}$).

An active layer of the comparative light-receiving element 2 was formed by co-evaporating fullerene ($C_{70}$) and DBP with a weight ratio of $C_{70}$:DBP=9:1 as in the case of the light-receiving element 1. The active layer was formed to have a thickness of approximately 60 nm.

A second buffer layer of the comparative light-receiving element 2 was formed to have a thickness of approximately 60 nm by evaporating molybdenum oxide.

A second electrode of the comparative light-receiving element 2 was formed to have a thickness of approximately 70 nm using ITO by a sputtering method.

Through the above steps, the comparative light-receiving element 2 was fabricated.

[Current-Incident Light Intensity Characteristics of Light-Receiving Element 1]

Figure 19:
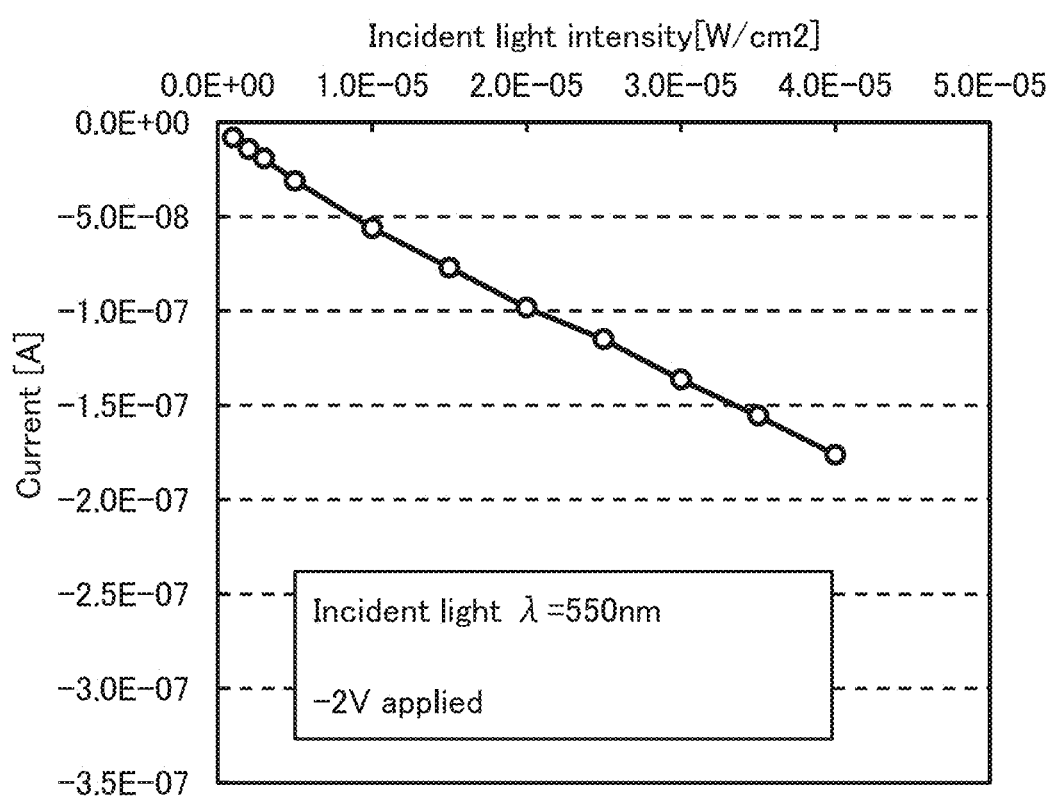
FIG. 19 shows a graph showing characteristics of a light-receiving element in Example 2.

FIG. 19 shows evaluation results of current-incident light intensity characteristics of the light-receiving element 1. In FIG. 19, the vertical axis represents current (A), and the horizontal axis represents the incident light intensity ($W/cm^2$).

A light-receiving region of the light-receiving element 1 was 2 mm×2 mm.

Under a condition where the light-receiving element 1, to which a voltage of −2 V was applied, was irradiated with light whose wavelength was λ=550 nm and intensity was from 1 $\mu W/cm^2$ to 40 $\mu W/cm^2$, the amount of current was measured. Note that the applied voltage (−2 V) is normally a value in the case where a positive bias is applied to an EL element. In other words, the positive bias is applied when the first electrode side has a high potential and the second electrode side has a low potential.

From FIG. 19, a linear change in the amount of current with respect to the incident light intensity is confirmed. This indicates that an image sensor using the light-receiving element 1 operates normally.

[Imaging Result]

Next, image sensor chips were fabricated using the light-receiving element 1 and the comparative light-receiving element 2, and imaging of still images were performed.

Figure 20A:
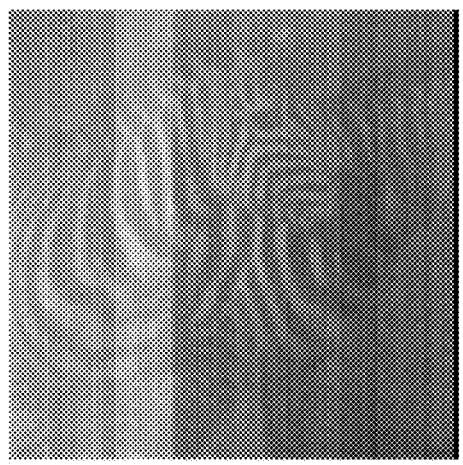
FIG. 20A, FIG. 20B, FIG. 20C, and FIG. 20D are imaging results in Example 2.
Figure 20B:
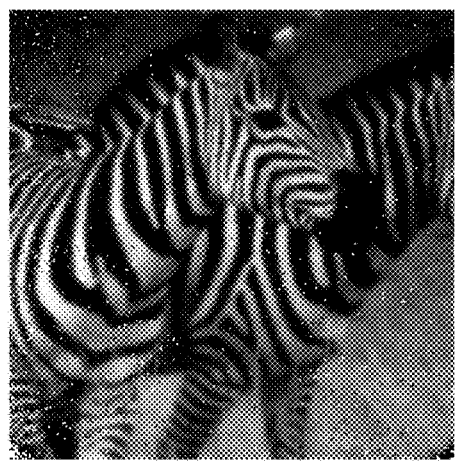

FIG. 20A and FIG. 20B show imaging results obtained by the image sensor chip using the light-receiving element 1. FIG. 20A shows data before correction. The data before correction was subjected to correction of gradation and unevenness between pixels with use of an all-white image and an all-black image which were captured in advance by the image sensor chip using the light-receiving element 1. FIG. 20B shows corrected data.

Figure 20C:
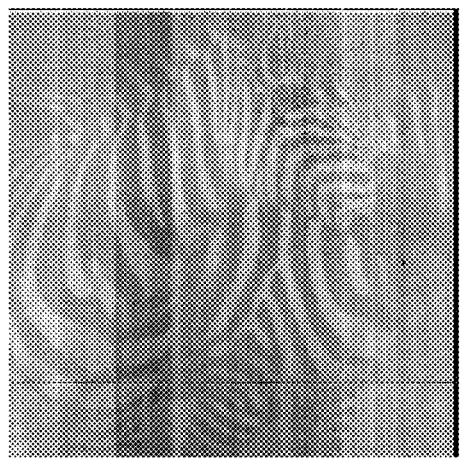
Figure 20D:
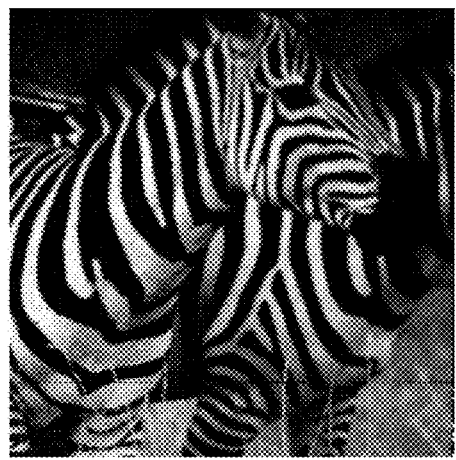

FIG. 20C and FIG. 20D show imaging results obtained by the image sensor chip using the comparative light-receiving element 2. FIG. 20C shows data before correction. The data before correction was subjected to correction of gradation and unevenness between pixels with use of an all-white image and an all-black image which were captured in advance by the image sensor chip using the comparative light-receiving element 2. FIG. 20D shows corrected data.

As shown in FIG. 20A to FIG. 20D, in both cases of using the light-receiving element 1 and using the comparative light-receiving element 2, the image sensor chips enabled favorable imaging of the still images. In other words, use of the light-receiving element 1 having a structure common with the light-emitting element enabled imaging results comparable to those in the case of using the comparative light-receiving element 2 having a stacked structure suitable for an image sensor.

As described above, in this example, the image sensor with which favorable imaging can be conducted was able to be fabricated by using the light-receiving element having a structure common with the light-emitting element.

Example 3

In this example, fabrication results of a display device including a light-receiving element and a light-emitting element in a display portion will be described.

[Cross-Sectional Structure]

FIG. 21 illustrates a device structure forming a pixel of a display device.

One pixel of the display device fabricated in this example includes four elements, which are composed of organic EL elements OLED of three colors, Red (R), Green (G), and Blue (B) and one organic photodiode OPD, and circuits (driver circuits 43 and 44) driving these four elements independently.

The four elements are each provided over the substrate 151 (glass substrate). Furthermore, over the substrate 151, the driver circuit 43 electrically connected to the pixel electrode 111 of the organic photodiode OPD and the driver circuits 44 electrically connected to each pixel electrode 191 of the organic EL element OLED are provided. The organic photodiode OPD has a structure where light incident from a counter substrate side is sensed. Each organic EL element OLED has a top-emission structure where light is emitted toward the counter substrate side (the common electrode 115 side in FIG. 21). The pixel electrode 111 and the pixel electrode 191 each have a function of reflecting visible light.

In the four elements, respective hole-transport layers are separately formed. Furthermore, light-emitting layers of the organic EL elements OLED of respective colors and an active layer of the organic photodiode OPD are separately formed. Specifically, the organic photodiode OPD includes a hole-transport layer 186 and the active layer 113; the red organic EL element OLED includes a hole-transport layer 196R and a light-emitting layer 193R; the green organic EL element OLED includes a hole-transport layer 196G and a light-emitting layer 193G; and the blue organic EL element OLED includes a hole-transport layer 196B and a light-emitting layer 193B.

Common layers 112, 114a, and 114b and the common electrode 115 are common between the four elements and formed using a common mask. In this example, the common layer 112 serves as a hole-injection layer, the common layer 114a serves as an electron-transport layer, and the common layer 114b serves as an electron-injection layer. The common electrode 115 has a function of transmitting visible light and a function of reflecting visible light.

In the above manner, only by a change in structure from separate formation of the light-emitting elements of three colors, R, G, and B, to separate formation of the four-type elements including the organic photodiode OPD, photosensors can be formed on an entire surface of a display portion of an organic EL display. The structure of the display device of this example is superior in a process, cost and design to the case where a photosensor is incorporated as a separate module, which facilitates the display device to downsize and have flexibility.

An imaging method in the display device of this example is described with reference to FIG. 1C. Imaging by the display device of this example is performed in such a manner that reflected light from an object for imaging is sensed by the organic photodiode OPD with use of light emitted from the organic EL elements OLED as a light source.

In the case of taking an image of a fingerprint of the finger 52 touching the substrate 59 (counter substrate) as illustrated in FIG. 1C, light emitted from the organic EL elements OLED is reflected by the finger 52 on the substrate 59, and the organic photodiode OPD senses the reflected light. At this time, a difference of reflectivity due to ridges and valleys of the fingerprint is utilized, so that imaging of the fingerprint can be conducted.

Moreover, in the display device of this example, a black resin layer is provided for the counter substrate. The black resin layer corresponds to the light-blocking layer BM in FIG. 2A. By providing the black resin layer, light emission of the organic EL element OLED is reflected inside the display device, whereby it is possible to inhibit the reflected light from being directly incident on the organic photodiode OPD. Furthermore, the black resin layer is used for adjusting a range where the organic photodiode OPD captures images. The diameter of an opening portion of the black resin layer is set to be aligned with the aimed imaging range, which can prevent a captured image to be blurred.

Imaging of fingerprints can be performed by sensing only monochromatic light, and color imaging is not necessary. However, in the display device of this example, the organic EL elements of R, G, and B are sequentially made to emit light, and their reflective light are sensed in time division, whereby color imaging is also possible. For example, it is possible to scan color images arranged over the counter substrate. In the case of using this method, organic photodiodes OPD having sensitivity with respect to a whole region of visible light are only have to be arranged, and it is not necessary to arrange individual organic photodiodes OPD for R, G, and B; this method is advantageous for high definition.

[Examination of Light-Receiving Element]

As described above, in the display device of this example, the common electrode 115 that is an upper electrode has a function of transmitting visible light and a function of reflecting visible light, and both the organic EL element OLED and the organic photodiode OPD employ a microcavity structure. Accordingly, the color purity of the organic EL element OLED can be improved, and the width of a wavelength to be sensed by the organic photodiode OPD is narrowed.

Figure 22:
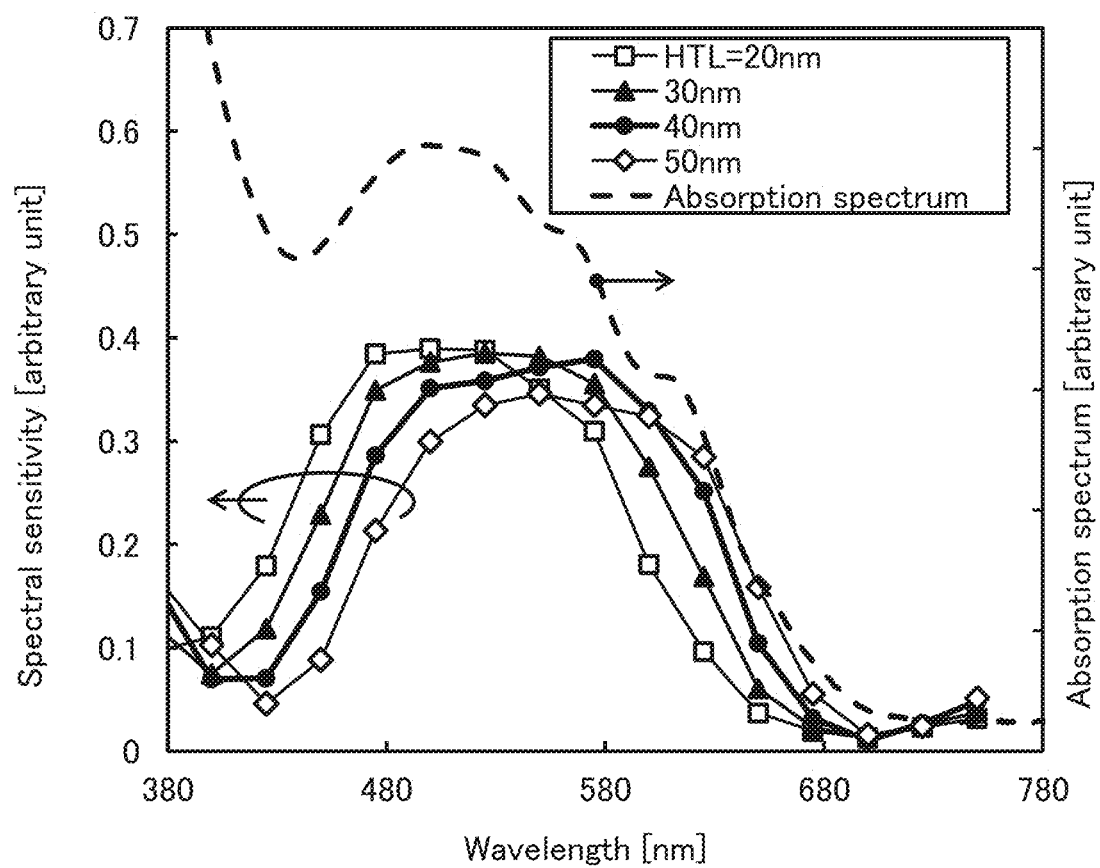
FIG. 22 is a graph showing a relation between spectral sensitivity dependence on wavelength and a thickness of a hole-transport layer.

FIG. 22 shows a relation between the wavelength dependence of spectral sensitivity and the thickness of the hole-transport layer in a light-receiving element employing the same structure as that of the organic photodiode OPD used in the display device of this example. FIG. 22 also shows a normalized absorption spectrum of the light-receiving element. In FIG. 22, the first vertical axis represents spectral sensitivity (arbitrary unit), the second vertical axis represents an absorption spectrum (arbitrary unit), and the horizontal axis represents a wavelength (unit: nm).

Note that materials of the light-receiving element of this example are similar to those of the light-receiving element 1 (Table 1) in Example 2 except that a stacked-layer structure including an alloy film of silver (Ag), palladium (Pd), and copper (Cu) (Ag—Pd—Cu (APC)) and an indium tin oxide film containing silicon oxide (ITSO) is used for the pixel electrode 111 and that PCPPn is used for the hole-transport layer.

As shown in FIG. 22, it was found that the absorption band of the light-receiving element exists in the whole region of visible light and that the absorbance is lowered as the wavelength becomes longer in a red region. Meanwhile, it was found that the spectral sensitivity of the light-receiving element has a peak, and that the peak is shifted depending on the thickness of the hole-transport layer. From these, it was confirmed that the thickness of the hole-transport layer of the organic photodiode OPD has necessity to be adjusted as appropriate with respect to a wavelength region to be sensed.

In this example, imaging of fingerprints is performed by making the green organic EL element OLED emit light. Thus, an organic photodiode OPD including a hole-transport layer with a thickness of 40 nm and enabling a wide range from blue to red colors to be covered centering around green (wavelength: approx. 550 nm), was employed in the display device of this example.

Figure 23:
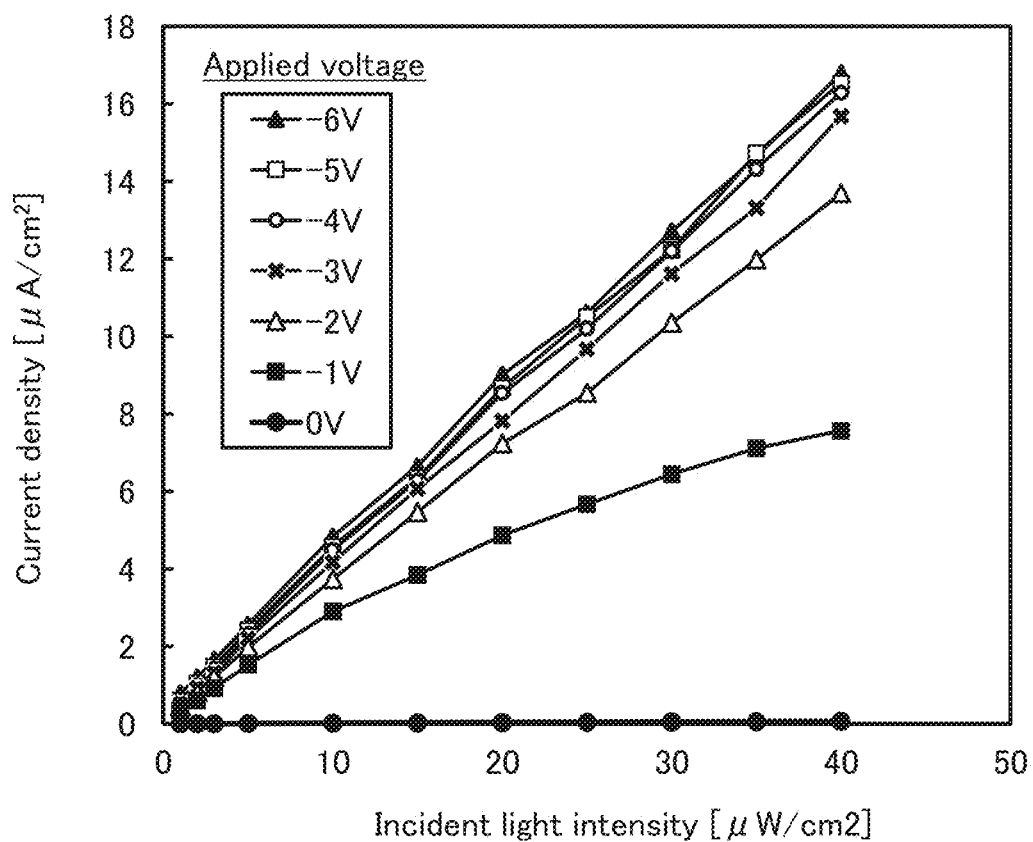
FIG. 23 is a graph showing a relation between incident light intensity and photocurrent.

FIG. 23 shows a relation between incident light intensity and photocurrent when the organic photodiode OPD including a hole-transport layer with a thickness of 40 nm was irradiated with monochromatic light with a wavelength of 550 nm. In FIG. 23, the vertical axis represents current density (unit: $\mu A/cm^2$), and the horizontal axis represents incident light intensity (unit: $\mu W/cm^2$).

As shown in FIG. 23, a linear relation between incident light intensity and photocurrent was confirmed when the applied voltage was lower than or equal to −2 V. In particular, when the applied voltage was higher than or equal to −3 V and lower than or equal to −6 V, small voltage dependence and saturated regions were confirmed.

In the case of scanning images, sensing in analog grayscale is required. Furthermore, in the case of scanning a color image, a wide wavelength range that can be sensed is required. Thus, it is necessary to have linearity between the incident light intensity and photocurrent and a wide saturated region with respect to the wide wavelength range. It was confirmed from FIG. 22 and FIG. 23 that the organic photodiode OPD that shares a part of the device structure with the organic EL element OLED satisfies the above requirements and operates as a photosensor without problems.

[Structure of Display Device]

In this example, an active matrix display device with a screen size of 3.07 inches in diagonal, a pixel count of 360 (H)×540 (V), a pixel pitch of 120 μm×120 μm, and a resolution of 212 ppi was fabricated. A gate driver was incorporated, and an external IC as a source driver was implanted by a COG method. The read circuit was set to output an analog voltage sequentially.

In the display device of this example, a transistor using an oxide semiconductor for a semiconductor layer was used as a switching element. A transistor using a CAAC-OS for a semiconductor layer has a feature of an extremely low off-state current. Owing to this feature, there is an advantage in that imaging with a global shutter system is possible in terms of sensing. In addition, in terms of a still image, the number of image rewrites can be reduced, and a driving leading low power consumption (IDS driving) becomes possible.

Note that IDS driving is idling stop driving for operation with a lower frame frequency than normal operation. In the IDS driving, rewriting of image data is stopped after writing processing of image data is performed. Increasing the interval between writing of image data and subsequent writing of image data can reduce the power that would be consumed by writing of image data in that interval. The frame frequency in the IDS driving can be higher than or equal to 1/100 and lower than or equal to 1/10 of that in the normal operation (typically, higher than or equal to 60 Hz and lower than or equal to 240 Hz). Video signals for a still image are the same between consecutive frames. Thus, the IDS driving mode is particularly effective in displaying a still image.

The image rewriting operation normally causes noise with respect to a sensor, which makes a reduction in the SN ratio. However, in the IDS driving, sensing can be performed under the following condition: the image rewriting operation is stopped while displaying an image is kept. Thus, sensing can be performed without being affected by noise due to the image rewrites, and a reduction in the SN ratio can be inhibited.

In the display device of this example, one frame was divided into a display period and a sensing period. During the sensing period, rewriting an image was not performed by using IDS driving, so that noise generated in sensing was reduced. For fingerprint identification and scanning of images, light emitted by the organic EL element OLED was used as a light source; thus, it is necessary to keep luminance of light emitted by the organic EL element OLED constant. In this case, by employing IDS driving, noise can be reduced and sensing can be performed favorably.

[Display Result]

Figure 24:
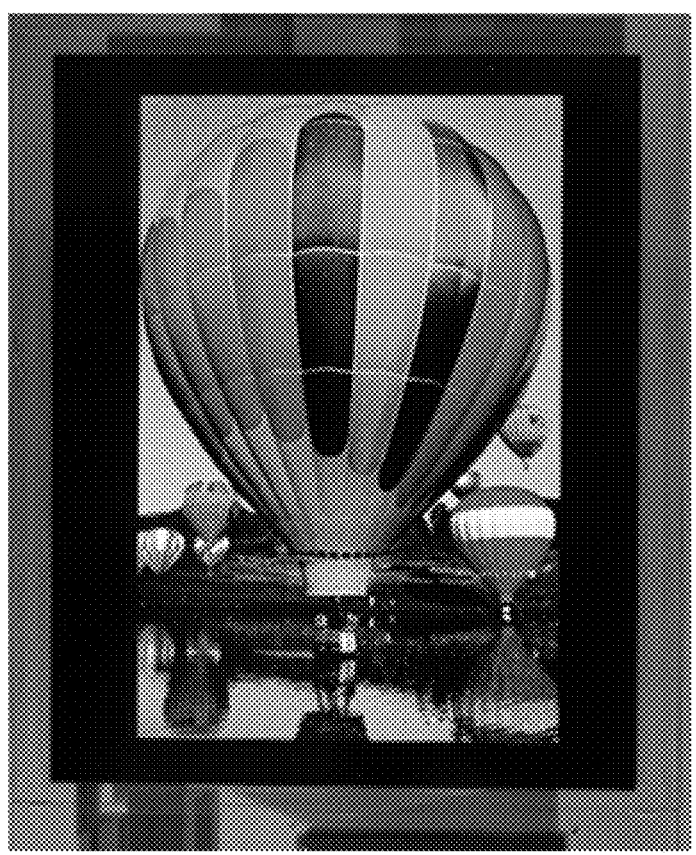
FIG. 24 shows a display result of a display device in Example 3.

FIG. 24 shows a display result of the display device in this example. As shown in FIG. 24, it was confirmed that an image can be favorably displayed in a display portion of the display device including the light-receiving element and the light-emitting element.

[Imaging Result]

Figure 25:
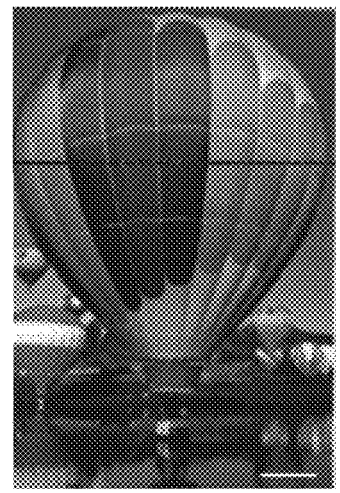
FIG. 25 shows an imaging result of a display device in Example 3.

FIG. 25 shows an imaging result obtained by using the organic photodiode OPD with light emitted by the organic EL element OLED, as a light source, in the display device of this example. Furthermore, image correction was conducted on the captured image with values of sensed white and black display, which were measured in advance, as reference values. In the image correction, a portion in the captured image, where a sensed value is an outlier from the reference value, was corrected to the value of black display.

The result shown in FIG. 25 was obtained by capturing an image in the following manner: the image was printed on paper, and the paper was positioned on the display device so that a printed side of the paper faces the display device. The exposure time was 1.78 msec, and the read time was 248 msec. Color imaging was performed by RGB time division. As shown in FIG. 25, it was confirmed that the color image can be favorably captured by using the display device of this example.

Furthermore, a finger was put on the display device, imaging of a fingerprint was performed by making the green organic EL element OLED emit light, whereby a pattern due to ridges and valleys of the fingerprint was able to be favorably captured. From this, it was confirmed that an image with a high resolution substantially the same level as that of the fingerprint was able to be captured.

Reference Numerals

C1: capacitor, C2: capacitor, EL: light-emitting element, IR: light-emitting element, L1: distance, L2: distance, LE: lens, M1: transistor, M2: transistor, M3: transistor, M4: transistor, M5: transistor, M6: transistor, M7: transistor, OLED: organic EL element, OPD: organic photodiode, OUT1: wiring, OUT2: wiring, PD: light-receiving element, PIX1: pixel circuit, PIX2: pixel circuit, SUB: substrate, V1: wiring, V2: wiring, V3: wiring, V4: wiring, V5: wiring, 10A: display device, 10B: display device, 10C: display device, 10D: display device, 10E: display device, 10F: display device, 10G: display device, 10H: display device, 10J: display device, 10K: display device, 10L: display device, 10M: display device, 21: light emission, 22: light, 23a: light, 23b: reflected light, 23c: light, 23d: reflected light, 41: transistor, 42: transistor, 43: driver circuit, 44: driver circuit, 50A: display device, 50B: display device, 51: substrate, 52: finger, 53: layer including light-receiving element, 55: layer including transistor, 57: layer including light-emitting element, 59: substrate, 100A: display device, 100B: display device, 100C: display device, 100D: display device, 110: light-receiving element, 111: pixel electrode, 112: common layer, 113: active layer, 114: common layer, 114a: common layer, 114b: common layer, 115: common electrode, 142: adhesive layer, 143: space, 146: lens array, 147: colored layer, 148: colored layer, 148a: colored layer, 148b: colored layer, 148c: colored layer, 149: lens, 151:

substrate, 152: substrate, 153: substrate, 154: substrate, 155: adhesive layer, 162: display portion, 164: circuit, 165: wiring, 166: conductive layer, 172: FPC, 173: IC, 182: buffer layer, 184: buffer layer, 186: hole-transport layer, 190: light-emitting element, 191: pixel electrode, 192: buffer layer, 193: light-emitting layer, 193B: light-emitting layer, 193G: light-emitting layer, 193R: light-emitting layer, 194: buffer layer, 195: protective layer, 195*a*: inorganic insulating layer, 195*b*: organic insulating layer, 195*c*: inorganic insulating layer, 196B: hole-transport layer, 196G: hole-transport layer, 196R: hole-transport layer, 201: transistor, 204: connection portion, 205: transistor, 206: transistor, 208: transistor, 209: transistor, 210: transistor, 211: insulating layer, 212: insulating layer, 213: insulating layer, 214: insulating layer, 215: insulating layer, 216: bank, 217: bank, 218: insulating layer, 221: conductive layer, 222*a*: conductive layer, 222*b*: conductive layer, 223: conductive layer, 225: insulating layer, 228: region, 231: semiconductor layer, 231*i*: channel formation region, 231*n*: low-resistance region, 242: connection layer, 6500: electronic device, 6501: housing, 6502: display portion, 6503: power button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9200: portable information terminal, 9201: portable information terminal

The invention claimed is:
1. A display device comprising a display portion,
wherein the display portion comprises a light-receiving element, a first light-emitting element, a bank, a colored layer, and an insulating layer,
wherein the light-receiving element comprises a first pixel electrode, an active layer, and a common electrode,
wherein the first light-emitting element comprises a second pixel electrode, a light-emitting layer, and the common electrode,
wherein the active layer is over the first pixel electrode,
wherein the active layer comprises a first organic compound,
wherein the light-emitting layer is over the second pixel electrode,
wherein the light-emitting layer comprises a second organic compound different from the first organic compound,
wherein the common electrode comprises a portion overlapping with the first pixel electrode with the active layer therebetween and a portion overlapping with the second pixel electrode with the light-emitting layer therebetween,
wherein the bank covers an end portion of the first pixel electrode and an end portion of the second pixel electrode,
wherein the bank is configured to electrically isolate the first pixel electrode and the second pixel electrode,
wherein each of the bank, the first pixel electrode, and the second pixel electrode comprises a portion in contact with a top surface of the insulating layer,
wherein the bank comprises an opening reaching the insulating layer, and
wherein the colored layer comprises a portion in contact with the insulating layer through the opening and a portion in contact with a top surface of the bank.
2. The display device according to claim 1,
wherein the bank is configured to absorb at least a part of light emitted by the first light-emitting element.
3. The display device according to claim 1,
wherein the display portion further comprises a lens,
wherein the lens comprises a portion overlapping with the light-receiving element, and
wherein light passing through the lens is incident on the light-receiving element.
4. The display device according to claim 3,
wherein the display portion further comprises a light-blocking layer,
wherein an end portion of the light-blocking layer overlaps with an end portion of the lens, and
wherein the light-blocking layer overlaps with the bank.
5. The display device according to claim 1,
wherein the display portion has flexibility.
6. A display module comprising:
the display device according to claim 1, and
at least one of a connector and an integrated circuit.
7. The display device according to claim 1,
wherein the colored layer comprises a portion in contact with a top surface of the first pixel electrode and a portion in contact with a side surface of the bank.
8. The display device according to claim 1,
wherein the colored layer comprises a color filter or a black matrix.
9. The display device according to claim 1,
wherein the light-receiving element further comprises a common layer.
10. The display device according to claim 1,
wherein the display portion further comprises a pixel,
wherein the pixel comprises the first light-emitting element, a second light-emitting element, and a third light-emitting element, and
wherein the first to third light-emitting elements and the light-receiving element are arranged in a matrix in the pixel.
11. A display device comprising a display portion,
wherein the display portion comprises a pixel comprising a light-receiving element and three subpixels of R, G, and B,
wherein the light-receiving element comprises:
a first pixel electrode;
a bank over the first pixel electrode;
a colored layer over the bank;
an active layer over the colored layer; and
a common electrode,
wherein each of the three subpixels comprises a light-emitting element, the light-emitting element comprising:
a second pixel electrode;
a light-emitting layer over the second pixel electrode; and
the common electrode,
wherein the active layer comprises a first organic compound, wherein the light-emitting layer comprises a second organic compound different from the first organic compound, wherein the colored layer comprises a portion overlapping with the first pixel electrode and the bank, wherein the colored layer comprises an opening over the first pixel electrode, wherein the common electrode comprises a portion overlapping with the first pixel electrode with the active layer therebetween and a portion overlapping with the second pixel electrode with the light-emitting layer therebetween, and wherein the three subpixels and the light-receiving element are arranged in a 2×2 matrix in the pixel.

12. A display device comprising a display portion, wherein the display portion comprises a light-receiving element, a first light-emitting element, a second light-emitting element, and a colored layer, wherein the light-receiving element comprises a first pixel electrode, a common layer, an active layer, and a common electrode, wherein the first light-emitting element comprises a second pixel electrode, the common layer, a first light-emitting layer, and the common electrode, wherein the second light-emitting element comprises a third pixel electrode, the common layer, a second light-emitting layer, and the common electrode, wherein the active layer is positioned over the first pixel electrode, wherein the active layer comprises a first organic compound, wherein the first light-emitting layer is positioned over the second pixel electrode, wherein the first light-emitting layer comprises a second organic compound different from the first organic compound, wherein the second light-emitting layer is positioned over the third pixel electrode, wherein the second light-emitting layer comprises a third organic compound different from the first organic compound and the second organic compound, wherein the common layer is positioned over the first pixel electrode, the second pixel electrode, and the third pixel electrode, wherein the common layer comprises a portion sandwiched between the first pixel electrode and the active layer, a portion sandwiched between the second pixel electrode and the first light-emitting layer, and a portion sandwiched between the third pixel electrode and the second light-emitting layer, wherein the common electrode comprises a portion overlapping with the first pixel electrode with the common layer and the active layer provided therebetween, a portion overlapping with the second pixel electrode with the common layer and the first light-emitting layer provided therebetween, and a portion overlapping with the third pixel electrode with the common layer and the second light-emitting layer provided therebetween, and wherein the colored layer comprises a portion sandwiched between the common layer and the first pixel electrode.

13. A display device comprising a display portion, wherein the display portion comprises a light-receiving element, a light-emitting element, a bank, and a colored layer, wherein the light-receiving element comprises a first pixel electrode, an active layer, and a common electrode, wherein the light-emitting element comprises a second pixel electrode, a light-emitting layer, and the common electrode, wherein the active layer is over the first pixel electrode, wherein the active layer comprises a first organic compound, wherein the light-emitting layer is over the second pixel electrode, wherein the light-emitting layer comprises a second organic compound different from the first organic compound, wherein the common electrode comprises a portion overlapping with the first pixel electrode with the active layer therebetween and a portion overlapping with the second pixel electrode with the light-emitting layer therebetween, wherein the bank covers an end portion of the first pixel electrode and an end portion of the second pixel electrode, wherein the bank is configured to electrically isolate the first pixel electrode and the second pixel electrode, wherein the colored layer comprises a portion overlapping with the first pixel electrode and the bank, and wherein the colored layer comprises an opening over the first pixel electrode.

14. The display device according to claim 13, wherein the display portion further comprises a lens and a light-blocking layer, wherein the lens comprises a portion overlapping with the light-receiving element, and wherein the light-blocking layer comprises an opening in a region overlapping with the light-receiving element and an opening in a region overlapping with the light-emitting element.

15. A display device comprising:

a first substrate;

a second substrate; and a display portion between the first substrate and the second substrate, wherein the display portion comprises a light-receiving element, a light-emitting element, a bank, a colored layer, a light-blocking layer, and a lens, wherein the first substrate is below the light-receiving element and the light-emitting element, wherein the second substrate is over the light-receiving element and the light-emitting element, wherein the light-receiving element comprises a first pixel electrode, an active layer, and a common electrode, wherein the light-emitting element comprises a second pixel electrode, a light-emitting layer, and the common electrode, wherein the active layer is over the first pixel electrode, wherein the active layer comprises a first organic compound, wherein the light-emitting layer is over the second pixel electrode, wherein the light-emitting layer comprises a second organic compound different from the first organic compound, wherein the common electrode comprises a portion overlapping with the first pixel electrode with the active layer therebetween and a portion overlapping with the second pixel electrode with the light-emitting layer therebetween, wherein the light-blocking layer comprises an opening in a region overlapping with the light-receiving element and an opening in a region overlapping with the light-emitting element, wherein the lens comprises a portion overlapping with the light-receiving element and a portion overlapping with the light-blocking layer, wherein the lens is above the light-receiving element and below the second substrate, wherein the bank covers an end portion of the first pixel electrode and an end portion of the second pixel electrode, and wherein the colored layer comprises a portion in contact with a top surface of the first pixel electrode and a side surface of the bank.

* * * * *